(12) United States Patent
Sugahara

(10) Patent No.: US 7,380,895 B2
(45) Date of Patent: Jun. 3, 2008

(54) DROPLET EJECTION DEVICE

(75) Inventor: Hiroto Sugahara, Ama-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 340 days.

(21) Appl. No.: 10/878,270

(22) Filed: Jun. 29, 2004

(65) Prior Publication Data

US 2004/0263547 A1 Dec. 30, 2004

(30) Foreign Application Priority Data

Jun. 30, 2003 (JP) .............................. 2003-187977
Mar. 31, 2004 (JP) .............................. 2004-106141

(51) Int. Cl.
*B41J 29/38* (2006.01)

(52) U.S. Cl. .................................. 347/9; 347/5; 347/15

(58) Field of Classification Search .................... 347/5, 347/9, 11, 15, 77

See application file for complete search history.

(56) References Cited

U.S. PATENT DOCUMENTS

| 4,468,679 A | | 8/1984 | Suga et al. ............. 346/140 R |
| 5,285,215 A | * | 2/1994 | Liker ........................... 347/11 |
| 6,164,748 A | * | 12/2000 | Taneya et al. ................ 347/15 |

FOREIGN PATENT DOCUMENTS

| JP | A 57-185159 | 11/1982 |
| JP | A 10/272774 | 10/1998 |

* cited by examiner

*Primary Examiner*—Lam S Nguyen
(74) *Attorney, Agent, or Firm*—Oliff & Berridge, PLC

(57) ABSTRACT

A droplet ejection device including: (a) a first ejecting portion capable of ejecting first droplets in a first direction; (b) a second ejecting portion capable of ejecting second droplets in a second direction intersecting the first direction, so that the droplets ejected from the first and second ejecting portions can be united to constitute a united droplet before landing on a receiver medium; and (c) a constituent-droplet-number controller which controls number of the droplets constituting the united droplet such that the united droplet is placed at a variable position on the receiver medium.

19 Claims, 32 Drawing Sheets

FIG.2
(a)
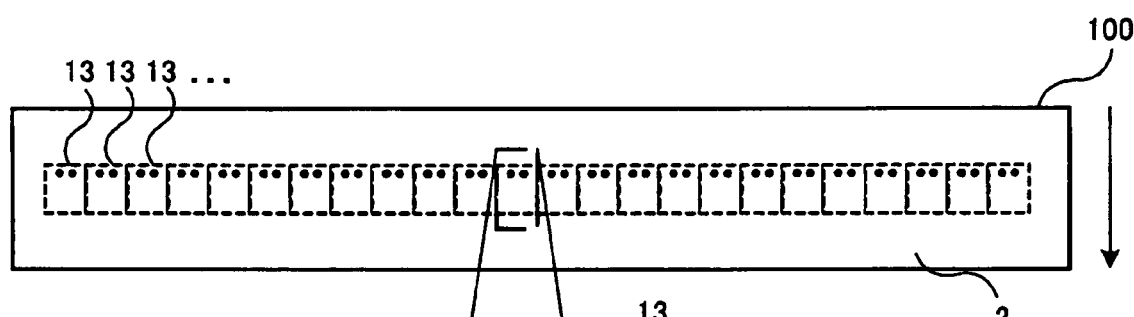
(b)
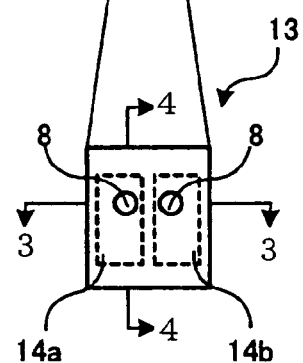

FIG.13

| FIRST EJECTING PORTION 14a | | SECOND EJECTING PORTION 14b | | VOLUME OF UNITED DROPLET(pl) | LANDING POSITION OF UNITED DROPLET |
|---|---|---|---|---|---|
| NUMBER OF TIMES OF EJECTIONS | TOTAL OF VOLUMES OF DROPLETS(pl) | NUMBER OF TIMES OF EJECTIONS | TOTAL OF VOLUMES OF DROPLETS(pl) | | |
| 4 | 8 | 0 | 0 | 8 | E |
| 3 | 6 | 1 | 2 | 8 | D |
| 2 | 4 | 2 | 4 | 8 | C |
| 1 | 2 | 3 | 6 | 8 | B |
| 0 | 0 | 4 | 8 | 8 | A |
| 8 | 16 | 0 | 0 | 16 | E |
| 6 | 12 | 2 | 4 | 16 | D |
| 4 | 8 | 4 | 8 | 16 | C |
| 2 | 4 | 6 | 12 | 16 | B |
| 0 | 0 | 8 | 16 | 16 | A |
| 12 | 24 | 0 | 0 | 24 | E |
| 9 | 18 | 3 | 6 | 24 | D |
| 6 | 12 | 6 | 12 | 24 | C |
| 3 | 6 | 9 | 18 | 24 | B |
| 0 | 0 | 12 | 24 | 24 | A |

FIG.25

| FIRST EJECTING PORTION 14a | | SECOND EJECTING PORTION 14b | | VOLUME OF UNITED DROPLET(pl) | LANDING POSITION OF UNITED DROPLET |
|---|---|---|---|---|---|
| NUMBER OF TIMES OF EJECTIONS | TOTAL OF VOLUMES OF DROPLETS(pl) | NUMBER OF TIMES OF EJECTIONS | TOTAL OF VOLUMES OF DROPLETS(pl) | | |
| 3 | 6 | 0 | 0 | 6 | V |
| 2 | 4 | 1 | 2 | 6 | W |
| 1 | 2 | 2 | 4 | 6 | X |
| 0 | 0 | 3 | 6 | 6 | Y |
| 6 | 12 | 0 | 0 | 12 | V |
| 4 | 8 | 2 | 4 | 12 | W |
| 2 | 4 | 4 | 8 | 12 | X |
| 0 | 0 | 6 | 12 | 12 | Y |

DROPLET EJECTION DEVICE

This application is based on Japanese Patent Applications No. 2003-187977 filed in Jun. 30, 2003 and No. 2004-106141 filed in Mar. 31, 2004, the content of which is incorporated hereinto by reference.

BACKGROUND OF THE INVENTION

1. Field of the Invention

The present invention relates to a droplet ejection device for ejecting droplets toward a receiver medium.

2. Discussion of Related Art

There is known an inkjet printer which is capable of printing desired patterns of image on a printing medium, by ejecting ink droplets subjected to a gradation control, toward the printing medium through nozzles arranged in a print head of the printer. As the print head of such an inkjet printer, there is known a print head which is equipped with piezoelectric elements adapted to pressurize an ink, for ejecting the pressurized ink in the form of ink droplets. Owing to its accurate controllability and excellent durability, such a print head is widely used. The print head, required to perform a printing operation on a receiver medium with high resolution, is provided by a serial head repeatedly reciprocated above the receiver medium, or provided by a line head having nozzles a number of which corresponds to a required degree of resolution. Where the print head is provided by the serial head, there is a problem that the printing operation can not be performed at a high speed since the print head has to be reciprocated many times. Where the print head is provided by the line head, there is a problem that the print head can not be manufactured at a low cost since a large number of nozzles are necessarily arranged on the print head.

In view of such problems, there is proposed an inkjet printer, as disclosed in U.S. Pat. No. 4,468,679 (equivalent to JP-A-S57-185159), which includes a pair of nozzles each controlled to control timing and velocity of ejection of an ink droplet from the corresponding nozzle, such that the droplets ejected from one and the other of the pair of nozzles collide with each other before landing on a receiver medium. The colliding droplets form a united droplet which is placed at a desired position (see FIG. 2 of the U.S. publication).

In the inkjet printer disclosed in the above-identified U.S. publication, it is possible to place the droplet at a selected one of a large number of different positions with a small number of nozzles provided in the print head. Owing to this advantage, where the print head is provided by a serial head, the printing speed can be increased with a reduced number of times of reciprocating motions of the print head. Where the print head is provided by a line head, the manufacturing cost can be reduced with a reduced number of nozzles to be provided in the print head. In the inkjet printer, however, the timing and velocity of the ejection of each ink droplet have to be controlled with considerably high accuracy requiring a complicated control system. Further, even if the complicated control system is established in the printer, the ejection control can not be achieved with high degree of freedom.

SUMMARY OF THE INVENTION

It is therefore an object of the present invention to provide a droplet ejection device which is made relatively simple in construction at a low cost and which is capable of forming a desired image with high resolution at a high speed. This object may be achieved according to any one of first through fourth aspects of the invention which are described below.

The first aspect of the invention provides a droplet ejection device comprising: (a) a first ejecting portion capable of ejecting first droplets in a first direction; (b) a second ejecting portion capable of ejecting second droplets in a second direction intersecting the first direction, so that the droplets ejected from the first and second ejecting portions can be united to constitute a united droplet before landing on a receiver medium; and (c) a constituent-droplet-number controller which controls number of the droplets constituting the united droplet such that the united droplet is placed at a variable position on the receiver medium.

In the present droplet ejection device, a desired image can be formed with high resolution, owing to the placement of the united droplet at a variable position on the receiver medium, which can be made by simply controlling the number of the droplets constituting the united droplets. Where the droplet ejection device is used with a line head which is not moved relative to the receiver medium in a primary scanning direction, the high resolution image can be formed even without arranging the ejecting portions with high density. Thus, it is possible to manufacture the line head at a low cost. Where the droplet ejection device is used with a serial head, it is possible to reduce number of times of reciprocating motions of a carriage carrying the serial head, thereby leading to formation of the image at a higher speed.

According to the second aspect of the invention, in the droplet ejection device in the first aspect of the invention, the constituent-droplet-number controller includes a constituent-droplet-number-ratio control portion which controls a ratio between numbers of the respective first and second droplets constituting the united droplet, for controlling the position at which the united droplet is placed.

According to the third aspect of the invention, in the droplet ejection device in the second aspect of the invention, the constituent-droplet-number-ratio control portion includes an ejected-droplet-number control portion which is connected to the first and second ejecting portions and which controls number of the droplets ejected from the first and second ejecting portions.

According to the fourth aspect of the invention, in the droplet ejection device in any one of the first through third aspects of the invention, the droplet ejection device further comprising: an ejection controller which is connected to the first and second ejecting portions and which controls at least one of a point of time at which each of the droplets is ejected from a corresponding one of the first and second ejecting portions, and a velocity of each of the ejected droplets, such that the ejected droplets are united to constitute the united droplet before landing on the receiver medium.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 2 is a set of two views of an ejection face of a print head of the inkjet printer of FIG. 1, wherein a general view showing an entirety of the ejection face is given at (a), while an enlarged view showing one of ejection units arranged on the ejection face is given at (b);

FIG. 13 is a table indicating a relationship among the numbers of ink droplets ejected from ink ejecting portions of the print head of FIG. 11, the volumes of the ejected ink droplets and the landing position of the united ink droplet;

FIG. 25 is a table indicating a relationship among the numbers of ink droplets ejected from ink ejecting portions of the print head of FIG. 16, the volumes of the ejected ink droplets and the landing position of the united ink droplet;

DETAILED DESCRIPTION OF THE PREFERRED EMBODIMENT

Figure 1:
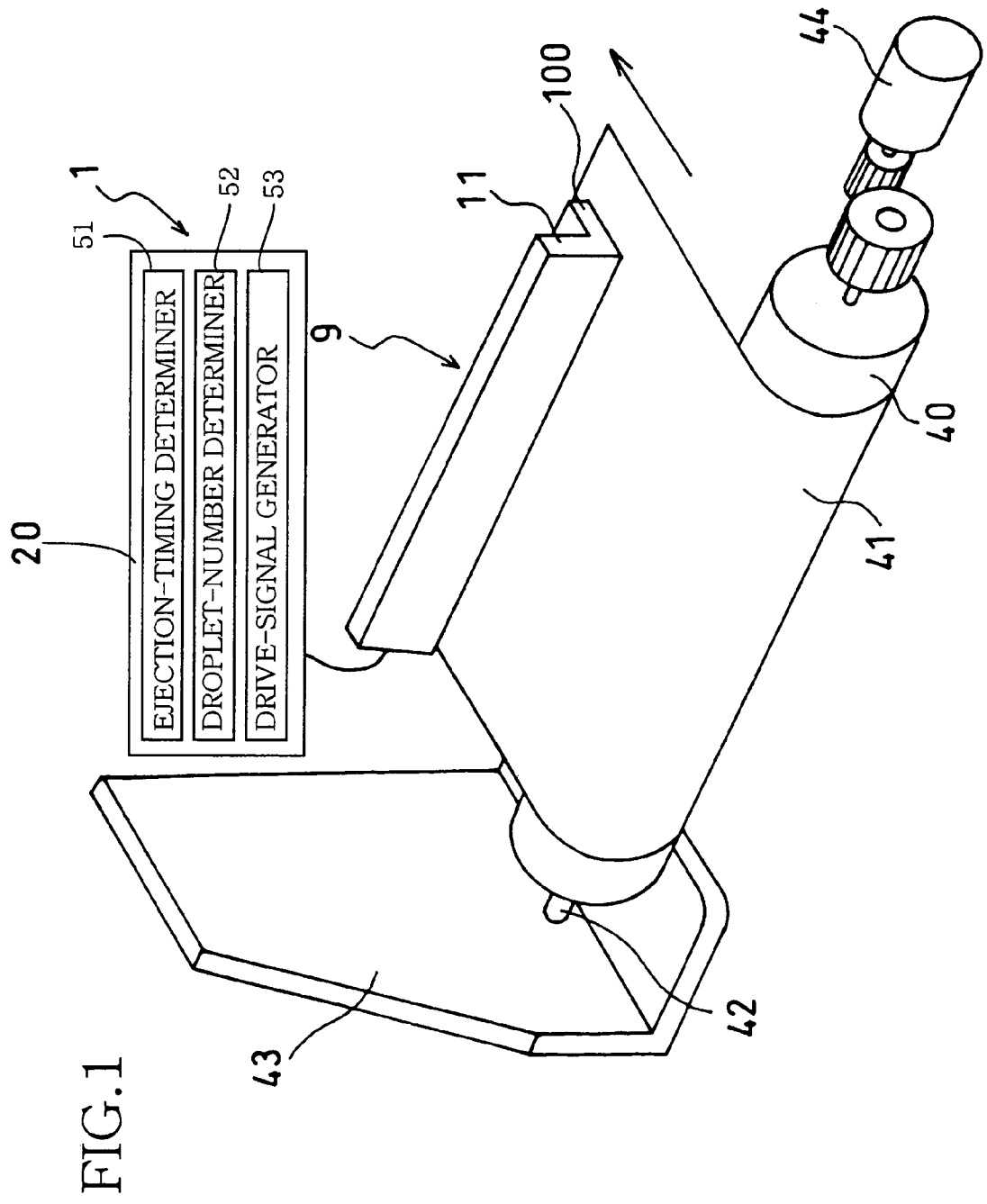
FIG. 1 is a perspective view schematically illustrating a basic arrangement of an inkjet printer equipped with a droplet ejection device which is constructed according to a first embodiment of the invention.

FIG. 1 is a view schematically illustrating a basic arrangement of an inkjet printer 1 equipped with a droplet ejection device which is constructed according to a first embodiment of the invention. As shown in FIG. 1, the inkjet printer 1 includes: a platen roller 40 constituting a feeding device for feeding a receiver medium in the form of a paper sheet 41; a print head 9 arranged to eject ink droplets toward the paper sheet 41 set on the platen roller 40; and a controller 20 for controlling operations of the print head 9 and other components which are incorporated in the inkjet printer 1.

The platen roller 40 is mounted on a driven shaft 42, and is rotatably attached to a frame 43 through the driven shaft 42. The platen roller 40, together with the driven shaft 42, is rotated by a motor 44. With the rotation of the platen roller 40, the paper sheet 41 supplied from a paper sheet cassette (not shown) is fed at a constant rate in a feed direction indicated by arrow in FIG. 1, so that a printing operation is performed on the paper sheet 41, with ejection of the ink droplets from the print head 9. After the printing operation, the paper sheet 41 carrying a printed image is ejected onto a paper sheet tray (not shown). A sheet supplying mechanism for supplying the paper sheet 41 and a sheet ejecting mechanism for ejecting the paper sheet 41 are not shown in FIG. 1. In the present embodiment, the inkjet printer 1 is provided with the single print head 9, for performing a black-and-white printing operation. However, the inkjet printer 1 may be provided with a plurality of print heads, for example, four print heads for yellow (Y), magenta (M), cyan (C) and black (B) inks, for performing a color printing operation.

As is apparent from FIG. 2, the print head 9 is a line head which is elongated in a direction perpendicular to the feed direction. This print head 9, fixed relative to the frame 43, includes a main body 100 elongated along a straight line extending in a predetermined direction, and a proximal portion 11 extending in a direction perpendicular to a width direction of the main body 100. The main body 100 provides an ejection face 2 (which is described below), while the proximal portion 11 serves to support the main body 100.

As shown in FIG. 2, the multiplicity of nozzles 8 are formed in the ejection face 2 of the main body 100 of the print head 9, such that the nozzles 8 are arranged along a straight line parallel with the longitudinal direction of the print head 9. The print head 9 is positioned relative to the platen roller 40 such that the ejection face 2 is opposed to and parallel with the paper sheet 41 when the sheet 41 is being fed by the platen roller 40. Thus, the ink droplets, which are ejected from the nozzles 8 in accordance with control of the controller 20, are ejected toward the paper sheet 41.

Figure 3:
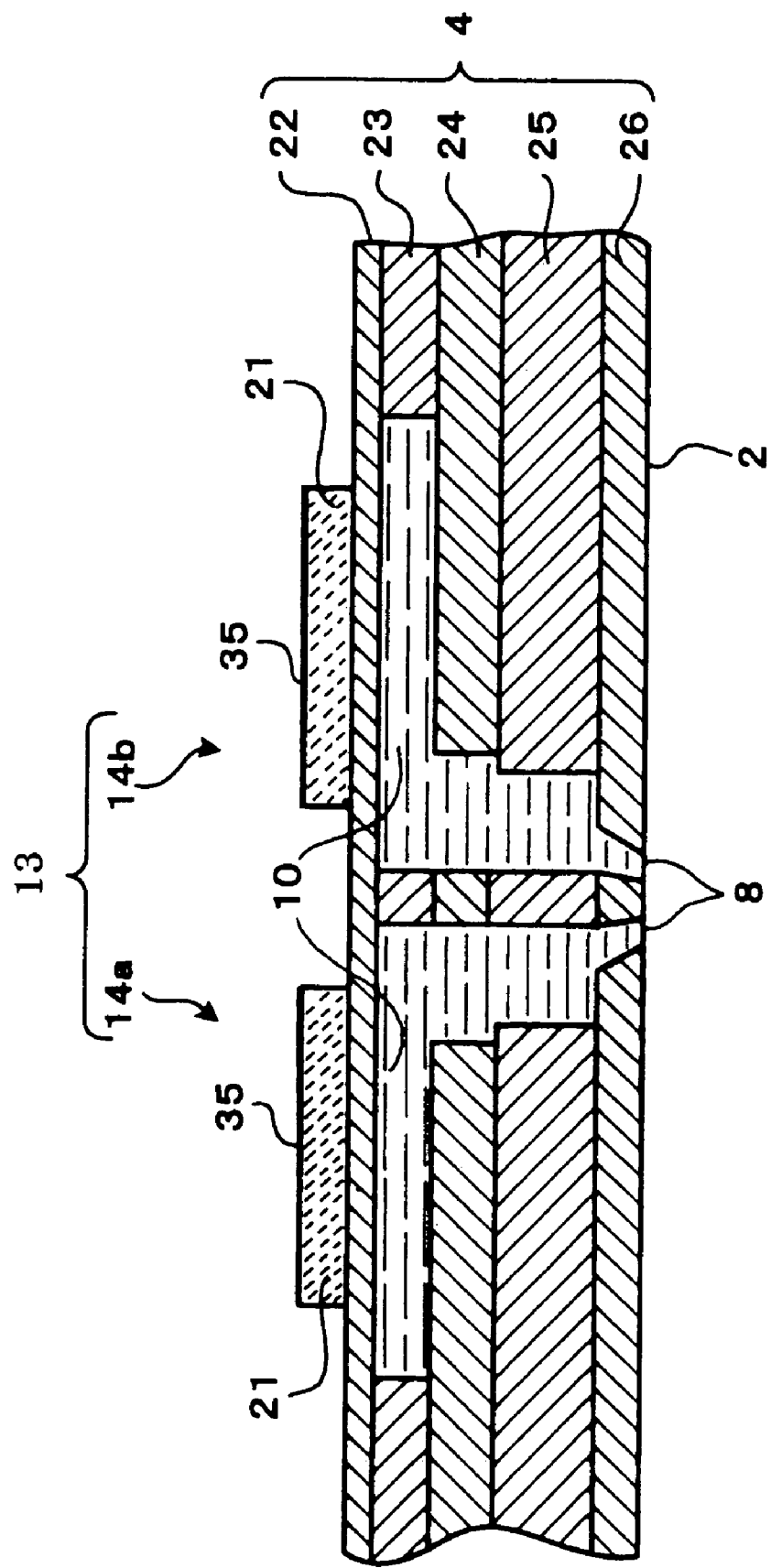
FIG. 3 is a front view partly in cross section of the print head of the inkjet printer of FIG. 1, taken along line 3-3 of FIG. 2.
Figure 4:
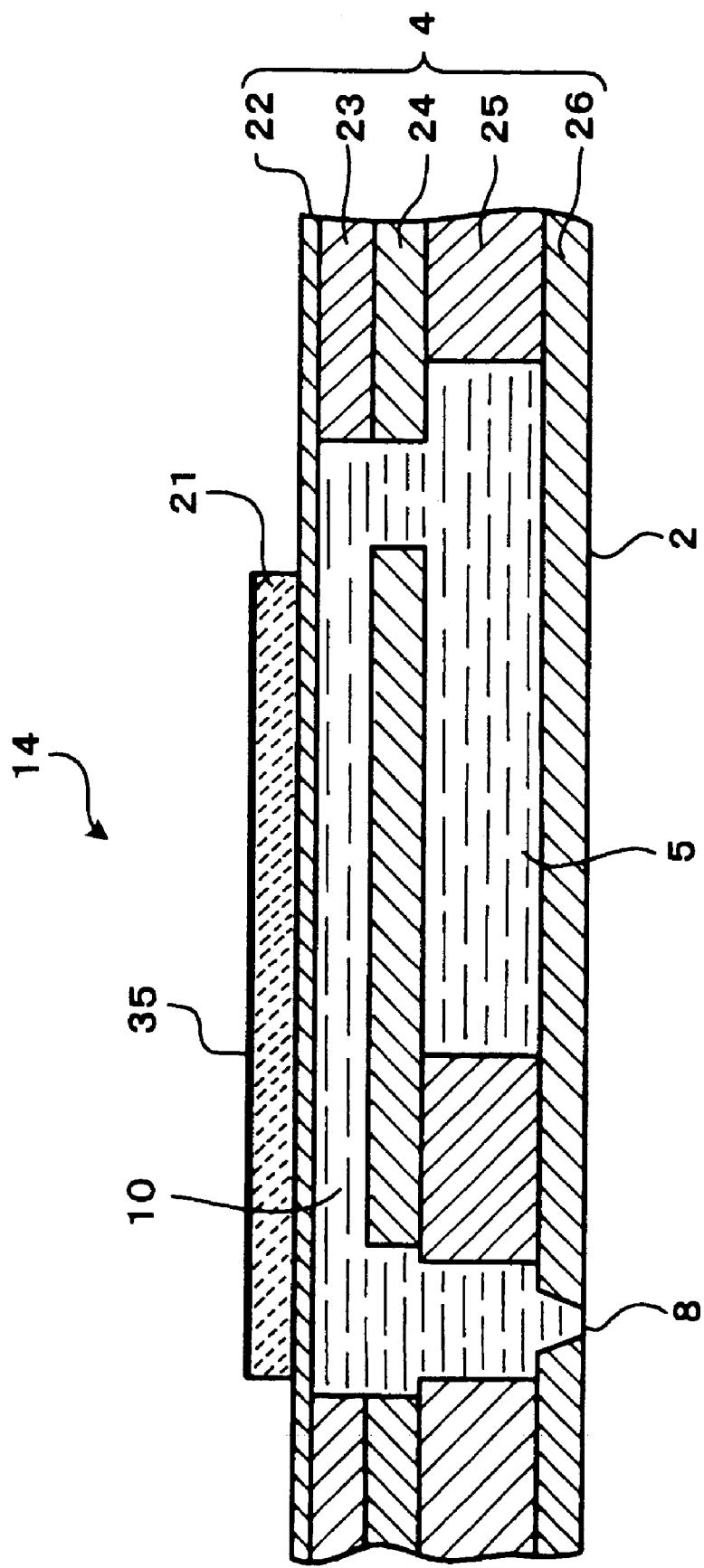
FIG. 4 is a side view partially in cross section of the print head of the inkjet printer of FIG. 1, taken along line 4-4 of FIG. 2.

FIG. 2 is a set of two views of the ejection face 2 of the main body 100 of the print head 9, wherein a general view showing an entirety of the ejection face 2 is given at (a), while an enlarged view showing one of ink ejection units 13 arranged on the ejection face 2 is given at (b). Arrow appearing in FIG. 2 indicates the feed direction of the paper sheet 41. As shown in FIG. 2, the ejection face 2 is provided by a rectangular flat face which is elongated in a direction perpendicular to the feed direction. FIG. 3 is a front view partly in cross section of the main body 100 of the print head 9, taken along line 3-3 of FIG. 2. FIG. 4 is a side view partially in cross section of the main body 100 of the print head 9, taken along line 4-4 of FIG. 2.

The main body 100 of the print head 9 includes a passage-defining unit 4, piezoelectric sheets 21 and individual electrodes 35. The passage-defining unit 4 has a laminated structure constituted by an actuator plate 22, a cavity plate 23, a supply plate 24, a manifold plate 25 and a nozzle plate 26 which are laminated on each other. The passage-defining unit 4 has a multiplicity of communication passages defined by through-holes formed through the plates 23-26. The main body 100 of the print head 9 has the multiplicity of ink ejection units 13 which are constituted by the communication passages, the piezoelectric sheets 21 and the individual electrodes 35.

The ejection units 13 are arranged in the above-described predetermined direction in which the main body 100 of the print head 9 is elongated. Each of the ejection units 13 has a pair of ink ejecting portions (first and second ink ejecting portions) 14a, 14b which are spaced apart from each other in the above-described predetermined direction, and is controlled by the controller 20 such that ink droplets having desired volumes are ejected from the first and second ink ejecting portions 14a, 14b toward the paper sheet 41. The first and second ink ejecting portions 14a, 14b have respective constructions which are substantially identical with each other. It is noted that the first ink ejecting portion 14a is shown in FIG. 4 while the second ink ejecting portion 14b is not shown in FIG. 4.

The first and second ink ejecting portions 14a, 14b of each ejection unit 13 are capable of ejecting the ink droplets, independently of each other. That is, the ejections of the ink droplets from the first and second ink ejecting portions 14a, 14b are made at respective points of time which can be either the same or different from each other. The ink droplets ejected from the first and second ink ejecting portions 14a, 14b are given respective velocities which can be either the same or different from each other. Each of the first and second ink ejecting portions 14a, 14b has the nozzle 8 and a pressure chamber 10 as a droplet chamber. The nozzle 8 is provided by a tapered hole which is formed through the nozzle plate 26 such that its diameter is decreased as viewed in a direction away from an inside surface of the nozzle plate 26 toward an outside surface (i.e., the ejection face 2) of the nozzle plate 26. The nozzle 8 is held in communication with a manifold chamber 5 through the pressure chamber 10. The tapered holes providing the nozzles 8 of the first and second ink ejecting portions 14a, 14b have respective axes which are inclined with respect to each other by a predetermined angle such that trajectories described by the ink droplets ejected from the respective first and second ink ejecting portions 14a, 14b intersect each other in a space between the ejection face 2 and the paper sheet 41. In other words, the first and second ejecting portions 14a, 14b are arranged to eject the ink droplets in respective first and second directions intersecting each other, so that the ink droplets ejected from the respective first and second ink ejecting portions 14a, 14b can be united to form a united ink droplet before landing on the paper sheet 41. Further, the nozzles 8 of the respective first and second ink ejecting portions 14a, 14b are constructed symmetrically with each other, so that a distance between the intersection of the above-described trajectories and the nozzle 8 of the first ink ejecting portion 14a and a distance between the intersection and the nozzle 8 of the second ink ejecting portion 14b are substantially equalized to each other.

The manifold chamber 5 constitutes a common passage held in communication with the multiplicity of pressure chambers 10, so that an ink is constantly supplied from an ink reservoir (not shown) to the pressure chambers 10 through the manifold chamber 5. Thus, the ink is distributed over the entirety of the main body 100 of the print head 9. In each pressure chamber 10 constituting a passage, the ink supplied through the manifold chamber 5 is pressurized so as to be ejected through the nozzle 8. The piezoelectric sheet 21 is located above a central portion of each pressure chamber 10, and has a plan configuration analogous to that of the pressure chamber 10. As described below in detail, a pressure in the pressure chamber 10 is increased when the piezoelectric sheet 21 is activated to be displaced.

The piezoelectric sheet 21 is formed of Lead Zircon Titanate (PZT) based ceramics material having a ferroelectricity, and is superposed on the actuator plate 22 which provides an upper wall of the pressure chamber 10. The actuator plate 22 is constantly grounded, and serves as a common electrode which is common to the multiplicity of ink ejecting portions 14a, 14b. On an upper surface of the piezoelectric sheet 21, there are disposed the individual electrodes 35 which are formed of Ag—Pd based metallic material. The individual electrodes 35 are connected to respective signal wires (not shown), which in turn are connected to the controller 20, so that an electric potential of each individual electrode 35 can be controlled by the controller 20 through the signal wires.

The piezoelectric sheet 21, which is sandwiched between the individual electrode 35 and the actuator plate 22 (serving as the common electrode), is polarizable in its thickness direction. In operation of the print head 9, a predetermined level of voltage is applied between the individual electrode 35 and the actuator plate 22, to produce an electric field polarizing the piezoelectric sheet 21, so that the piezoelectric sheet 21 functions as an active sheet. In this instance, the piezoelectric sheet 21 expands in its thickness direction, i.e., in the direction of polarization, while being strained in its surface direction due to a horizontal piezoelectric effect, whereby the piezoelectric sheet 21, together with the actuator plate 22, is deformed to be convexed toward the pressure chamber 10. Thus, the piezoelectric sheet 21 and the actuator plate 22 cooperate with each other to function as so-called unimorph actuator.

The controller 20 is provided to control operations of components of the inkjet printer 1 such as the motor 44 and the inkjet head 9. In the present embodiment, the controller 20 includes an ejection-timing determiner 51, a droplet-number determiner 52 and a drive-signal generator 53. The ejection-timing determiner 51 serves to determine timing of ejections of the ink droplets, namely, determine points of time at which the ink droplets are to be ejected from the ink ejecting portions 14a, 14b, such that the droplets ejected from the nozzles 8 of the respective first and second ink ejecting portions 14a, 14b collide to be united before landing on the paper sheet 41. The droplet-number determiner 52 serves to determine numbers of the ink droplets to be ejected from the respective first and second ink ejecting portions 14a, 14b per unit time, such that the united droplet is placed at a desired position on the paper sheet 41. The drive-signal generator 53 serves to generate drive signals on the basis of the determinations made by the ejection-timing determiner 51 and the droplet-number determiner 52, and then outputs the drive signals to the individual electrodes 35 of the ink ejecting portions 14a, 14b. Each of the drive signals generated by the drive-signal generator 53 is provided by a pulse train having a generally rectangular waveform. It is noted that the ejection-timing determiner 51 and the drive-signal generator 53 cooperate with each other to constitute an ejection controller, and that the droplet-number determiner 52 and the drive-signal generator 53 cooperate with each other to constitute a constituent-droplet-number controller including a constituent-droplet-number-ratio control portion and an ejected-droplet-number control portion.

There will next be described an operation of each of the ink ejecting portions 14a, 14b for ejecting the ink droplets. The controller 20 controls, prior to an ink ejection command, an electric circuit such that a predetermined voltage is applied between the individual electrode 35 and the actuator plate 22, so that the piezoelectric sheet 21 and the actuator plate 22 (which are adjacent to each other) are deformed to be convexed toward the pressure chamber 10, whereby a volume of the pressure chamber 10 is reduced. That is, as the inkjet printer 1 is brought into in its ready state with its power source being turned ON, the predetermined voltage is applied to the individual electrode 35, for reducing the volume of the pressure chamber 10. Each time the controller 20 receives the ejection command, the controller 20 controls the electric circuit such that the voltage between the individual electrode 35 and the actuator plate 22 is reduced to a ground level (e.g. substantially 0 V), so that the deformed piezoelectric sheet 21 and actuator plate 22 restore their original flat shapes. The controller 20 then controls the electric circuit such that the voltage applied to the individual electrode 35 is increased to the predetermined level at a predetermined point of time, so that the piezoelectric sheet 21 and the actuator plate 22 are newly deformed to be convexed toward the pressure chamber 10.

When the deformed piezoelectric sheet 21 and actuator plate 22 restore their original shapes in response to the ejection command, the volume of the pressure chamber 10 is increased whereby the pressure in the pressure chamber 10 is reduced. The pressure reduction in the pressure chamber 10 causes the ink to be delivered from the manifold 5 to the pressure chamber 10. When the piezoelectric sheet 21 and the actuator plate 22 are newly deformed to be convexed toward the pressure chamber 10, the volume of the pressure chamber 10 is newly reduced whereby the pressure in the pressure chamber 10 is increased. The pressure increase in the pressure chamber 10 causes the ink to be ejected from the pressure chamber 10 through the nozzle 8. In the present embodiment, the piezoelectric sheet 21, the actuator plate 22 and the individual electrode 35 cooperate to provide a pressure-chamber-volume changer.

As described above, upon its receipt of the ejection command, the controller 20 reduces the above-described applied voltage to the ground level and then increases the applied voltage to the predetermined level at the predetermined point of time. In this instance, a length of time for which the applied voltage is held in the ground level corresponds to a value (L/a) obtained by dividing a length (L) between the manifold chamber 5 and the nozzle 8, by an acoustic velocity (a) in the ink. That is, by increasing the applied voltage to the predetermined level at a point of time at which the above-described length of time (hereinafter referred to as acoustic length AL) has just elapsed after the reduction of the applied voltage to the ground level, a pressure increase caused by the ink delivery to the pressure chamber 10 and a pressure increase caused by the volume reduction in the pressure chamber 10 coincide with each other, so that the ink droplet can be ejected at a high pressure. It is noted that the pressure fluctuation in the pressure chamber 10 remains as a residual pressure wave without changing its cyclic time of 2AL (twice the acoustic length AL), even after the ejection of the ink droplet.

Where a plurality of ink droplets are successively ejected from the ink ejecting portion 14a or 14b, the pulse train (as the drive signal generated by the drive-signal generator 53) consists of a plurality of first and second voltage-level regions which are alternately arranged. In the first voltage-level regions, the voltage is held in the above-described predetermined level, for causing the above-described pressure-chamber-volume changer to reduce the volume of the pressure chamber 10. In the second voltage-level regions, the voltage is held in the ground level, for causing the pressure-chamber-volume changer to reduce the volume of the pressure chamber 10. Each of the second voltage-level regions has a time length corresponding to the acoustic length AL, so that each of the successive ink droplets can be ejected at a high pressure. Further, in the present embodiment, a time interval between a transition from the second voltage-level region to the first voltage-level region, and the succeeding transition from the second voltage-level region to the first voltage-level region is arranged to correspond to 2AL (twice the acoustic length AL). Owing to this timing arrangement, a pressure wave generated for the ejection of each ink droplet is synchronized with a residual pressure wave that is another pressure wave generated for the ejection of the preceding ink droplet, whereby the consecutively generated pressure waves are superimposed on each other. Therefore, the currently ejected ink droplet is given a larger velocity than the previously ejected ink droplet, and catches up with the previously ejected ink droplet, so that the ink droplets are united with each other, before landing on the paper sheet 41 as the receiver medium.

Figure 5:
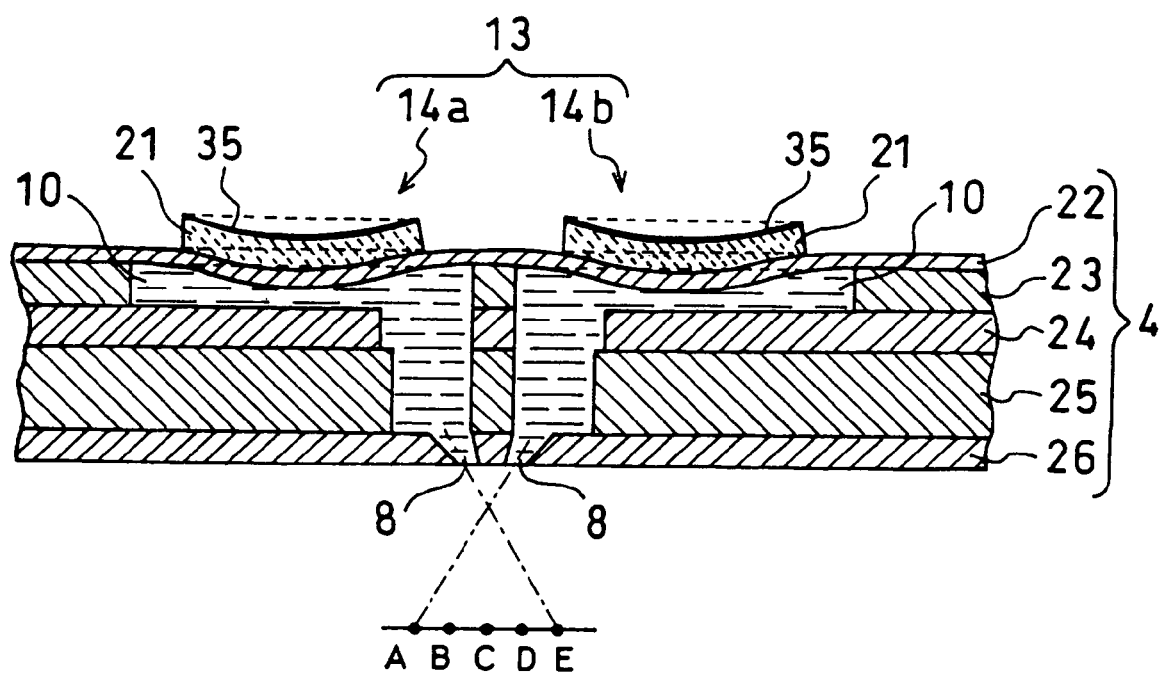
FIG. 5 is a view showing positions at which a united ink droplet (formed of ink droplets ejected from the ejection unit of FIG. 2) is to be placed.

Referring next to FIGS. 5-8, there will be described an operation of the ink ejection unit 13 with a constant volume of the united ink droplet, i.e., without a gradation control in accordance with an area gradation method. FIG. 5 is a view showing positions A-E at which the united ink droplet (formed of the ink droplets ejected from the ink ejection unit 13) is to be placed. FIGS. 6A, 7A and 8A are views showing respective examples of operation of the ink ejection unit 13. FIGS. 6B, 7B and 8B are graphs showing the waveforms of the pulse trains as the drive signals outputted from the drive-signal generator 53 to the ink ejecting portions 14a, 14b in the respective examples shown in FIGS. 6A, 7A and 8A. In each of the graphs of FIGS. 6B, 7B and 8B, the vertical axis represents the voltage applied between the individual electrode 35 and the actuator plate 22, while the horizontal axis represents a time. As shown in the graphs of FIGS. 6B, 7B and 8B, the voltage is held in the predetermined level during absence of the ejection command, and is reduced to the ground level in response to the ejection command. In this sense, a drive pulse included in the pulse train corresponds to each second voltage-level region of the pulse train rather than each first voltage-level region of the pulse train.

Figure 6A:
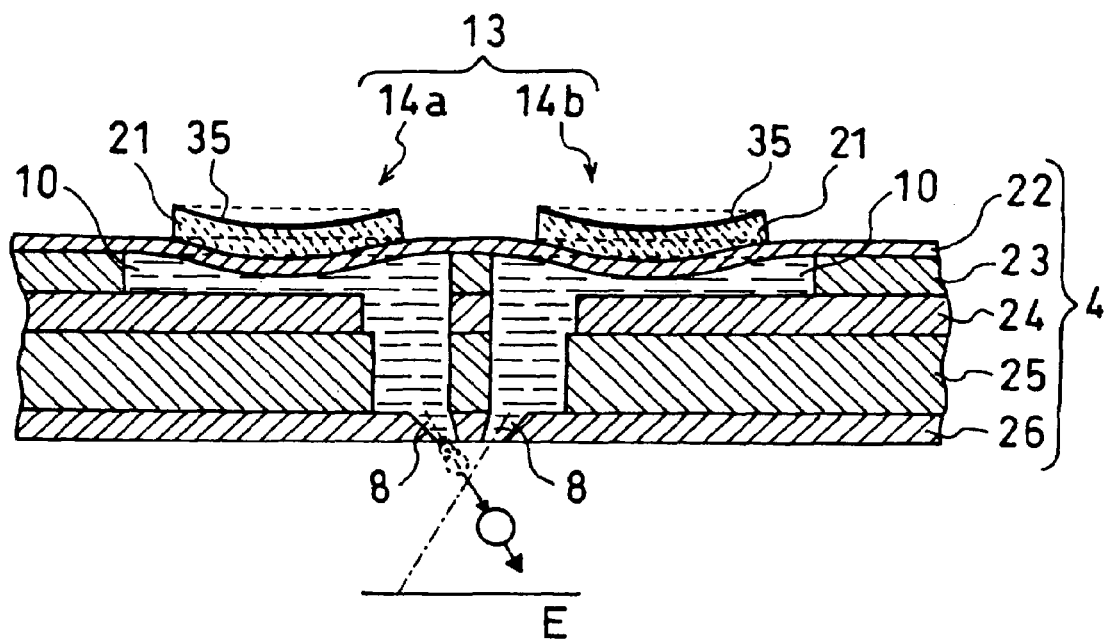
FIG. 6A is a view showing an example of an operation of the ejection unit of FIG. 2.
Figure 6B:
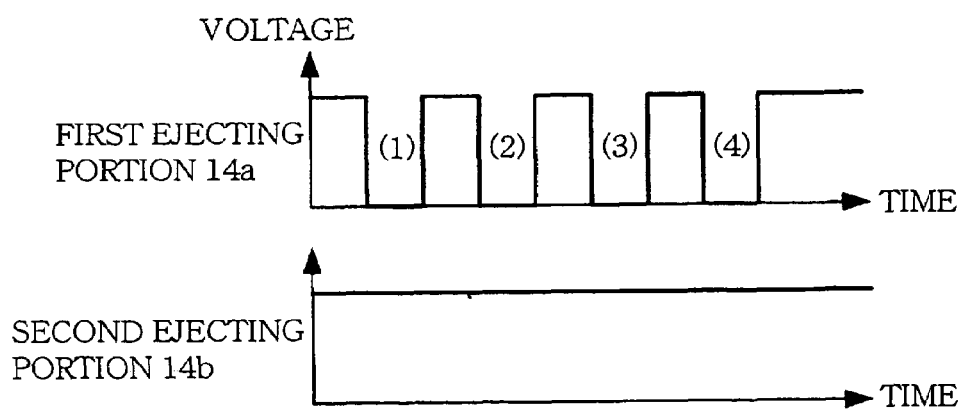
FIG. 6B is a graph showing waveforms of drive signals applied to the ejection unit in the example of the operation shown in FIG. 6A.
Figure 7A:
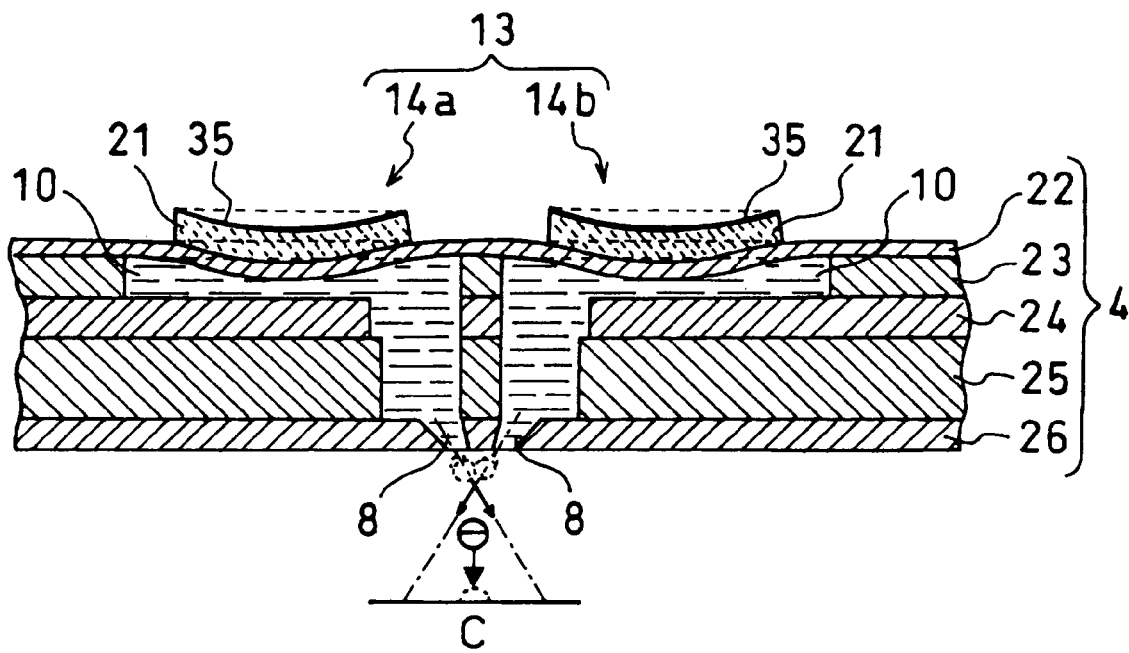
FIG. 7A is a view showing another example of the operation of the ejection unit of FIG. 2.
Figure 7B:
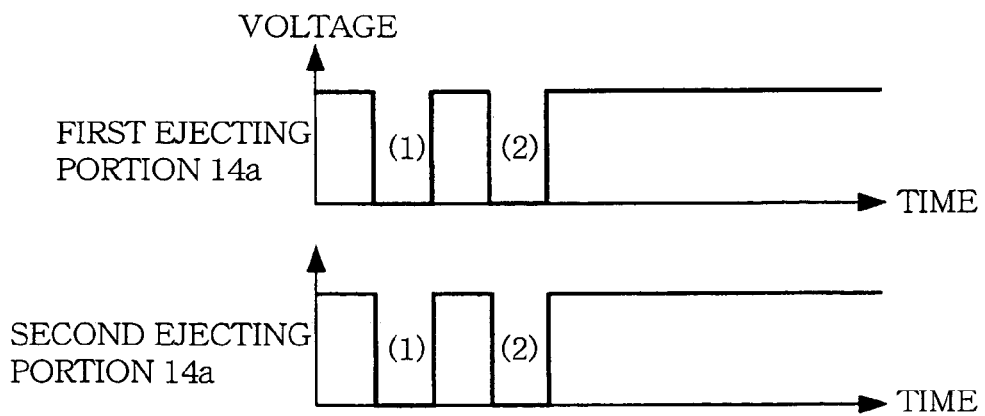
FIG. 7B is a graph showing waveforms of drive signals applied to the ejection unit in the example of the operation shown in FIG. 7A.
Figure 8A:
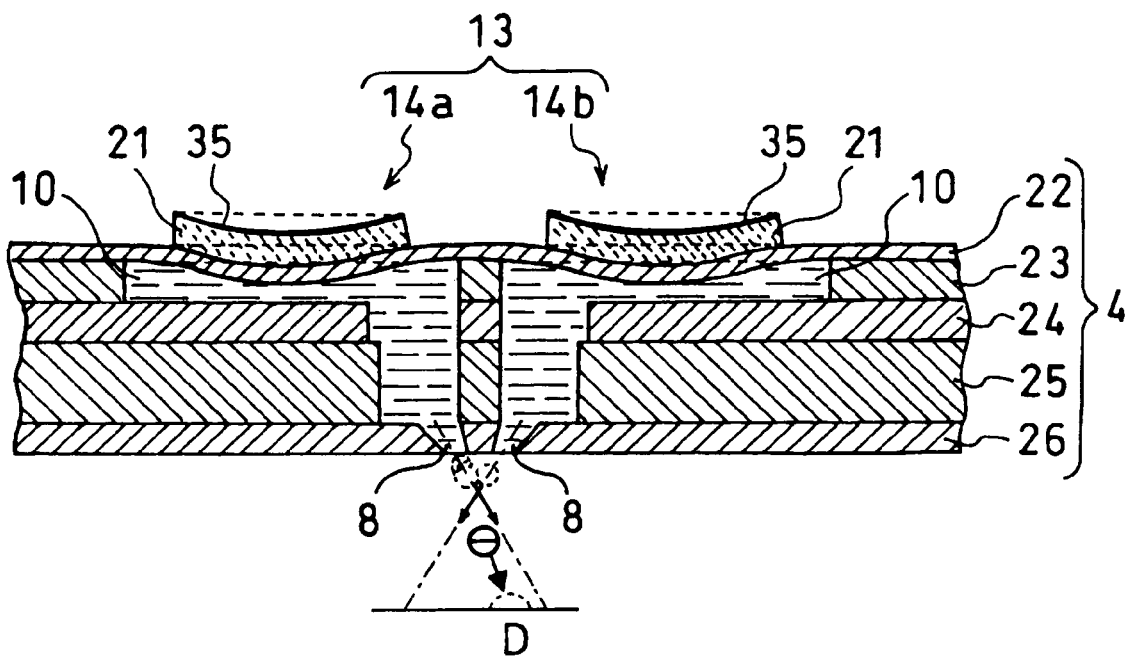
FIG. 8A is a view showing still another example of the operation of the ejection unit of FIG. 2.
Figure 8B:
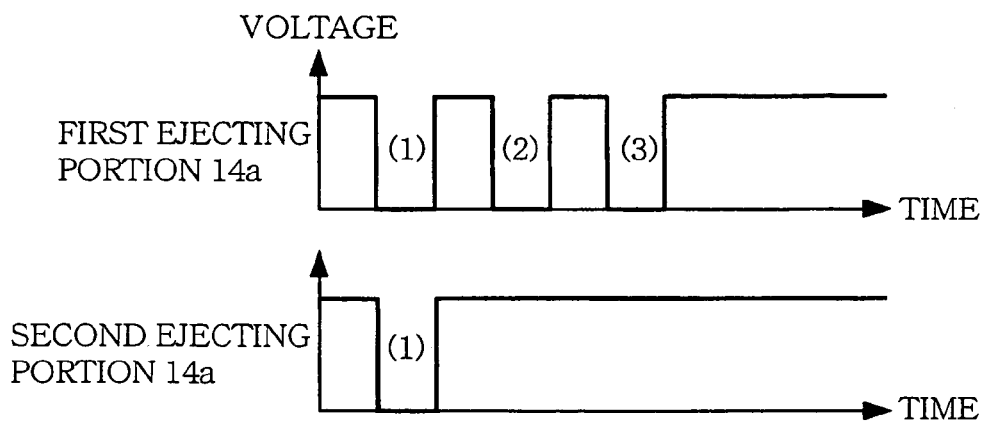
FIG. 8B is a graph showing waveforms of drive signals applied to the ejection unit in the example of the operation shown in FIG. 8A.

As shown in FIG. 5, the ink droplet or droplets ejected from the nozzle 8 of the first ink ejecting portion 14a and the ink droplet or droplets ejected from the nozzle 8 of the second ink ejecting portion 14b are united to constitute a united ink droplet, and the united ink droplet is then placed at a selected or desired one of the positions A-E which are equally spaced apart from each other. The droplet-number determiner 52 of the controller 20 determines, in view of the desired one of the positions A-E at which the united ink droplet is to be placed, the number of the ink droplets to be ejected from the respective first and second ink ejecting portions 14a, 14b per unit time. In other words, the droplet-number determiner 52 determines, in view of the desired one of the positions A-E, a ratio between the number of the ink droplets to be ejected from the nozzle 8 of the first ink ejecting portion 14a and the number of the ink droplets to be ejected from the nozzle 8 of the second ink ejecting portion 14b. In the present embodiment, the constituent-droplet-number controller constituted by the droplet-number determiner 52 and the drive-signal generator 53 changes the above-described ratio depending on the desired one of the positions A-E, with the volume of each of the ejected ink droplets being held substantially constant. For example, the above-described ratio is set to be 0:4 so that the united ink droplet is placed at the position A. The ratio is set to be 1:3, for placement of the united ink droplet at the position B. The ratio is set to be 1:1, for placement of the united ink droplet at the position C. The ratio is set to be 3:1, for placement of the united ink droplet at the position D. The ratio is set to be 4:0, for placement of the united ink droplet at the position E. It is noted that the united ink droplet has a volume substantially constant irrespective of which one of the positions A-E the united ink droplet is placed at.

Where four consecutive drive pulses (1)-(4) each having a width corresponding to the above-described AL (Acoustic Length) are outputted from the drive-signal generator 53 of the controller 20 to the individual electrode 35 of the first ink ejecting portion 14a, as shown in FIG. 6B, four ink droplets are successively ejected from the first ink ejecting portion 14a while no ink droplet is ejected from the second ink ejecting portion 14b. The four ink droplets ejected from the first ink ejecting portion 14a are united to constitute a united ink droplet, before landing on the receiver medium, as shown in FIG. 6A. The united ink droplet then lands on the position E which is located on an extension of the trajectory described by the ink droplets ejected from the first ink ejecting portion 14a.

Where the drive-signal generator 53 of the controller 20 outputs two consecutive drive pulses (1), (2) to the individual electrode 35 of each of the first and second ejecting portions 14a, 14b, as shown in FIG. 7B, two ink droplets are successively ejected from the first ink ejecting portion 14a while at the same time two ink droplets are successively ejected from the second ink ejecting portion 14b, so that the ratio between the number of the ink droplets ejected from the first ink ejecting portion 14a and the number of the ink droplets ejected from the second ink ejecting portion 14b is 1:1. The ink droplets ejected from the ink ejecting portions 14a, 14b have the same volumes. The ink droplet first ejected from the first ink ejecting portion 14a and the ink droplet first ejected from the second ink ejecting portion 14b are given the same velocities. The ink droplet second ejected from the first ink ejecting portion 14a and the ink droplet second ejected from the second ink ejecting portion 14b are given the same velocities. All of the ink droplets ejected from the ejecting portions 14a, 14b are united with each other, because the trajectories described by the ink droplets ejected from the respective first and second ink ejecting portions 14a, 14b intersect each other, and because the first ejected ink droplet is caught by the second ejected ink droplet which is given a larger velocity than the first ejected ink droplet. The united ink droplet then lands on the position C that is an intermediate position between the positions A, E which are located on the respective extensions of the trajectories described by the ink droplets ejected from the respective first and second ink ejecting portion 14a, 14b.

Where the drive-signal generator 53 of the controller 20 outputs three consecutive drive pulses (1)-(3) to the individual electrode 35 of the first ejecting portion 14a while outputting one drive pulse (1) to the individual electrode 35 of the second ejecting portion 14b, as shown in FIG. 8B, three ink droplets are successively ejected from the first ink ejecting portion 14a while one ink droplet is ejected from the second ink ejecting portion 14b, so that the ratio between the number of the ink droplets ejected from the first ink ejecting portion 14a and the number of the ink droplet ejected from the second ink ejecting portion 14b is 3:1. The ink droplets ejected from the ink ejecting portions 14a, 14b have the same volumes. The ink droplet first ejected from the first ink ejecting portion 14a and the ink droplet first ejected from the second ink ejecting portion 14b are given the same velocities. All of the ink droplets ejected from the ejecting portions 14a, 14b are united with each other, because the trajectories described by the ink droplets ejected from the respective first and second ink ejecting portions 14a, 14b intersect each other, and because the ink droplet first ejected from the first ejecting portion 14a is caught by the second ejected ink and the third ejected ink which are given larger velocities than the first ejected ink droplet. The united ink droplet then lands on the position D which is located between the positions A and E and which is distant from the position E by a distance equal to one fourth of the distance between the positions A and E. Since the three ink droplets successively ejected from the first ejecting portion 14a travel as a unit at a velocity slightly higher than the velocity of the ink droplet ejected from the second ejecting portion 14b, the actual landing position of the united ink droplet can be somewhat deviated from the position D, although an amount of this deviation is very small. Further, a sum of the volumes of the three ink droplets ejected from the first ejecting portion 14a is larger than three times the volume of the ink droplet ejected from the second ejecting portion 14b, by very small amount.

As is clear from the above description, the droplet-number determiner 52 of the controller 20 selects one of options as to the above-described ratio consisting of 0:4, 1:3, 2:2, 3:1 and 4:0, so that the united ink droplet is placed at a desired one of the positions A-E. It is noted that each adjacent pair of the ink ejection units 13 are spaced apart from each other by, preferably, such a spacing distance that permits a spacing distance between each adjacent pair of the positions A-E to be equal to a spacing distance between the position E (at which the united ink droplet ejected from one of the pair of the ink ejection units 13 can be placed) and the position A (at which the united ink droplet ejected from the other of the pair of the ink ejection units 13 can be placed).

Figure 9:
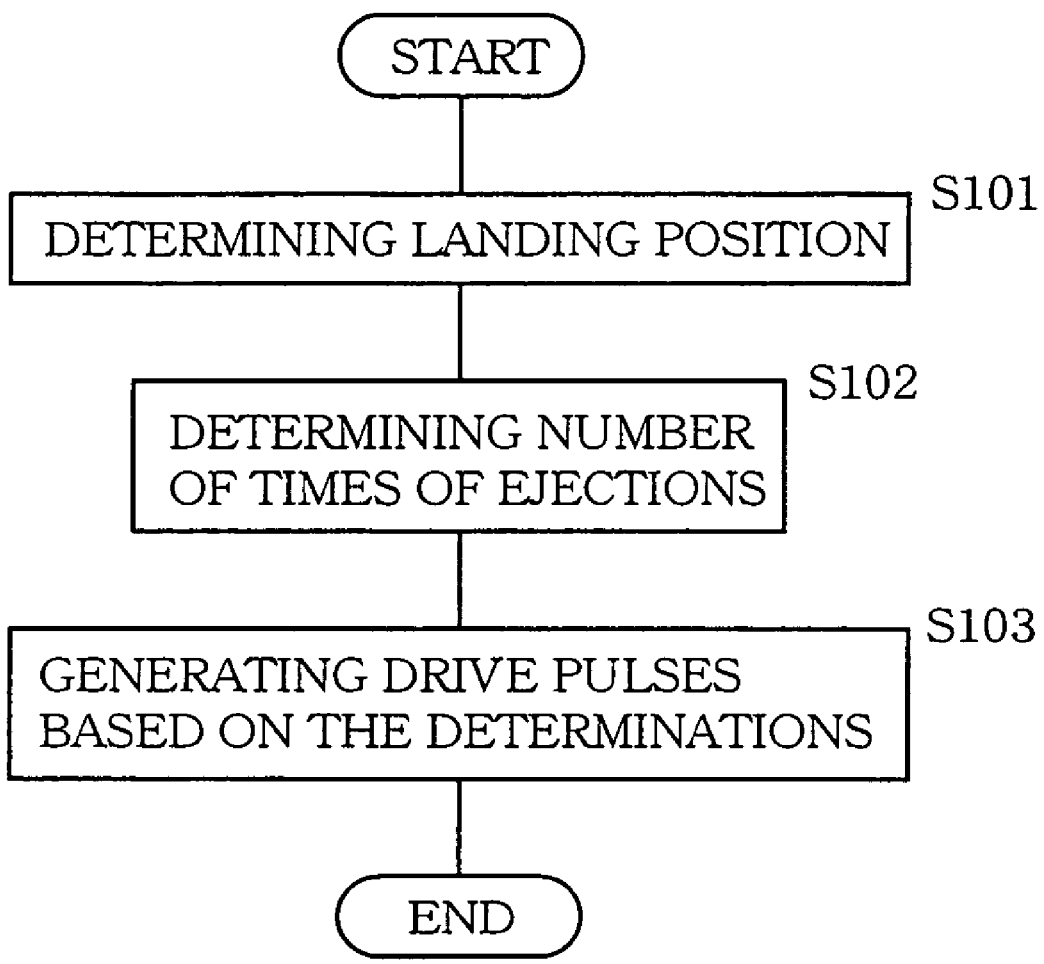
FIG. 9 is a flow chart showing an ink ejection control routine executed according to a control program stored in a controller of the inkjet printer of FIG. 1.

FIG. 9 is a flow chart illustrating an ink ejection control routine executed according to a control program stored in the controller 20.

This ink ejection control routine is initiated with a step S101 that is implemented to determine which one of the positions A-E the united ink droplet ejected from each of the ink ejection units 13 is to be placed at. Step S101 is followed by step S102 in which the numbers of the ink droplets to be ejected from the respective first and second ink ejecting portions 14a, 14b are determined by the droplet-number determiner 52 of the controller 20, depending upon the determined one of the positions A-E. In this instance, the number S1 of the ink droplets to be ejected from the first ink ejecting portion 14a and the number S2 of the ink droplets to be ejected from the second ink ejecting portion 14b are determined in accordance with the following expressions:

$$S1 = m-1 \quad (1);$$

$$S2 = n-m \quad (2);$$

where "n" represents the number of the positions A-E, and "m" represents the position of the determined one as counted from the left as seen in FIG. 5.

In the present embodiment, the number "n" of the positions A-E is five (n=5). According to the above expressions, the numbers S1 and S2 are one and three, respectively (S1=1, S2=3), where the determined one is the position B that is the second one as counted from the left (m=2).

Then, the control flow goes to step S103 in which the drive-signal generator 53 generates the drive pulses on the basis of the ejection timing determined by the ejection-timing determiner 51 and also the numbers S1, S2 determined by the droplet-number determiner 52. Where the united ink droplet is to be placed at the position B (S1=1, S2=3), the drive pulses are generated by the drive-signal generator 53, such that a first one of the three ink droplets is ejected from the second ink ejecting portion 14b concurrently with the ejection of the ink droplet from the first ink ejecting portion 14a, such that a second one of the three ink droplets is ejected from the second ink ejecting portion 14b when a length of time corresponding to 2AL has elapsed after the ejection of the first one, and such that a third one of the three ink droplets is ejected from the second ink ejecting portion 14b when the length of time corresponding to 2AL has elapsed after the ejection of the second one. That is, the second ink ejecting portion 14b receives three consecutive drive pulses whose pulse width and separation both correspond to AL, while the first ink ejecting portion 14a receives a single drive pulse concurrently with reception of first one of the three consecutive drive pulses by the second ink ejecting portion 14b. The first and second ink ejecting portions 14a, 14b eject the ink droplets in response to the drive pulses. It is note that the term "pulse separation" used in the present specification is interpreted to mean a time interval between the trailing edge of one of the consecutive drive pulses and the leading edge of the succeeding drive pulse.

Figure 10:
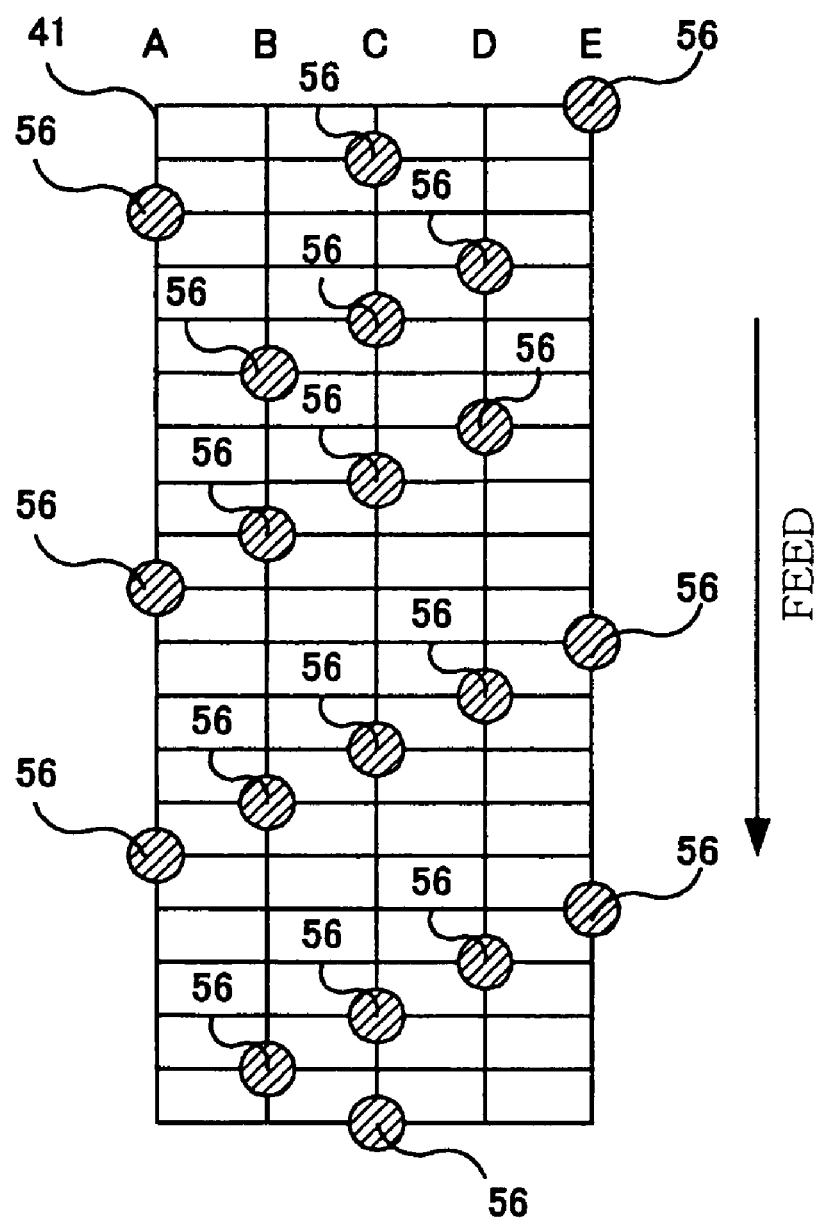
FIG. 10 is a view illustrating an example of placements of the united ink droplets made by the ejection unit of FIG. 2.

FIG. 10 is a view illustrating an example of placement of the united ink droplets performed by the ink ejection unit 13 in a printing operation. In FIG. 10, arrow indicates a feed direction in which the paper sheet 41 is fed in the printing operation. As is apparent from FIG. 10, a plurality of united ink droplets are successively placed at desired positions on the paper sheet 41. A spacing distance between each adjacent pair of vertical lines (parallel with the feed direction of the paper sheet 41) corresponds to the spacing distance between each adjacent pair of the positions A-E, while a spacing distance between each adjacent pair of horizontal lines (perpendicular to the feed direction of the paper sheet 41) corresponds to a distance by which the paper sheet 41 is fed after placement of each of the united ink droplets on the paper sheet 41. The united ink droplets have the same volume of 8 pl. Each of the united ink droplets is constituted by a total of four ink droplets each ejected from the first ink ejecting portion 14a or second ink ejecting portion 14b. The ratio between the number of the ink droplets ejected from the first ink ejecting portion 14a and the number of the ink droplets ejected from the second ink ejecting portion 14b varies depending upon which one of the five positions A-E each united ink droplet is placed at. The ink ejection unit 13 having the two ink ejecting portions 14a, 14b provides substantially the same degree of resolution as an ink ejection unit having five ink ejecting portions.

Further, in the present first embodiment, a desired image can be formed with high resolution, by simply controlling the ratio between the number of the droplets ejected from the first ink ejecting portion 14a and the number of the droplets ejected from the second ink ejecting portion 14b, through the drive signals transmitted from the controller 20 to the first and second ink ejecting portions 14a, 14b.

Further, the united droplet ejected from each of the ink ejection units 13 can be placed at a variable position, namely, at a selected one of the five positions A-E. Thus, the high resolution image can be formed even without arranging the nozzles 8 with high density in the main body 100 of the print head 9, thereby permitting the print head 9 to be manufactured at a low cost.

Further, where a plurality of ink droplets are successively ejected from the ink ejecting portion 14a or 14b, a time interval between a trailing edge of a drive pulse (i.e., a transition from the second voltage-level region to the first voltage-level region) and a trailing edge of the succeeding drive pulse (i.e., the succeeding transition from the second voltage-level region to the first voltage-level region) is arranged to correspond to 2AL (twice the acoustic length AL). Therefore, the currently ejected ink droplet is given a larger velocity than the previously ejected ink droplet, and accordingly catches up with the previously ejected ink droplet, thereby facilitating each ink droplet to catch up with the preceding ink droplet, so that the droplets successively ejected from each of the first and second ejecting portions can collide with each other at high probability, before landing on the receiver medium.

Figures 32A, 32B:
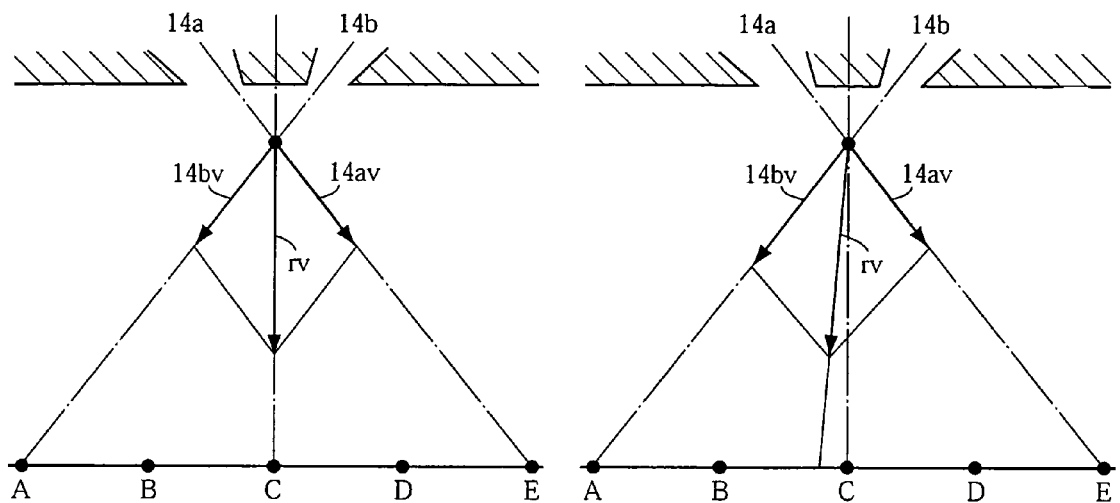
FIG. 32A is a view illustrating vectors representative of the ejected ink droplets in the above-described example of FIG. 7A.
FIG. 32B is a view illustrating vectors representative of the ejected ink droplets in a modification of the example of FIG. 7A.

In the first embodiment, the united ink droplet is placed at a selected one of the five positions A-E on the receiver medium. However, it is also possible to place the united ink droplet at a position which is other than the five positions A-E, by controlling the velocities of the ejected ink droplets such that the velocity of the ink droplet ejected from the first ink ejecting portion 14a and the velocity of the ink droplet ejected from the second ink ejecting portion 14a are different from each other. In the above-described example shown in FIG. 7A, the drive signals supplied to the respective first and second ink ejecting portions 14a, 14b are provided by the pulse trains having the same wave forms, so that the number of the ink droplets ejected from the first ink ejecting portion 14a and the number of the ink droplets ejected from the second ink ejecting portion 14b are equal to each other, and so that each ink droplet ejected from the first ink ejecting portion 14a and each ink droplet ejected from the second ink ejecting portion 14b are given the same velocity. Therefore, as shown in FIG. 32A, a vector 14av representative of a momentum and a direction of each ink droplet ejected from the first ink ejecting portion 14a and a vector 14bv representative of a momentum and a direction of each ink droplet ejected from the second ink ejecting portion 14b are symmetrical with each other with respect to a center line (indicated by one-dot chain line), so that a resultant vector rv (i.e., a sum of the two vectors 14av, 14bv) is directed to the point C at which the center line interests the landing surface. In this instance, if the drive signal supplied to the second ink ejecting portion 14b is adapted to have a voltage higher than that of the drive signal supplied to the first ink ejecting portion 14a, each ink droplet ejected from the second ink ejecting portion 14b can be given a larger velocity than each ink droplet from the first ink ejecting portion 14a, thereby making it possible to place the united ink droplet, for example, at a point located between the positions B and C, as shown in FIG. 32B. Thus, the united droplet can be placed at a selected one of a larger number of different positions than in an arrangement in which the ratio between the number of the ink droplets ejected from the first ink ejecting portion 14a and the number of the ink droplets ejected from the second ink ejecting portion 14b is changed while the velocities of the ink droplets ejected from the respective first and second ink ejecting portions 14a, 14b are not made different from each other. The selection of the actual placement position among the larger number of options makes it possible to form an image having higher resolution.

Referring next to FIGS. 11-15, there will be described a droplet ejection device which is constructed according to a second embodiment of the invention. The droplet ejection device of this second embodiment is substantially identical with that of the first embodiment, except for its print head 9A and controller 20A which will be described below.

Figure 11:
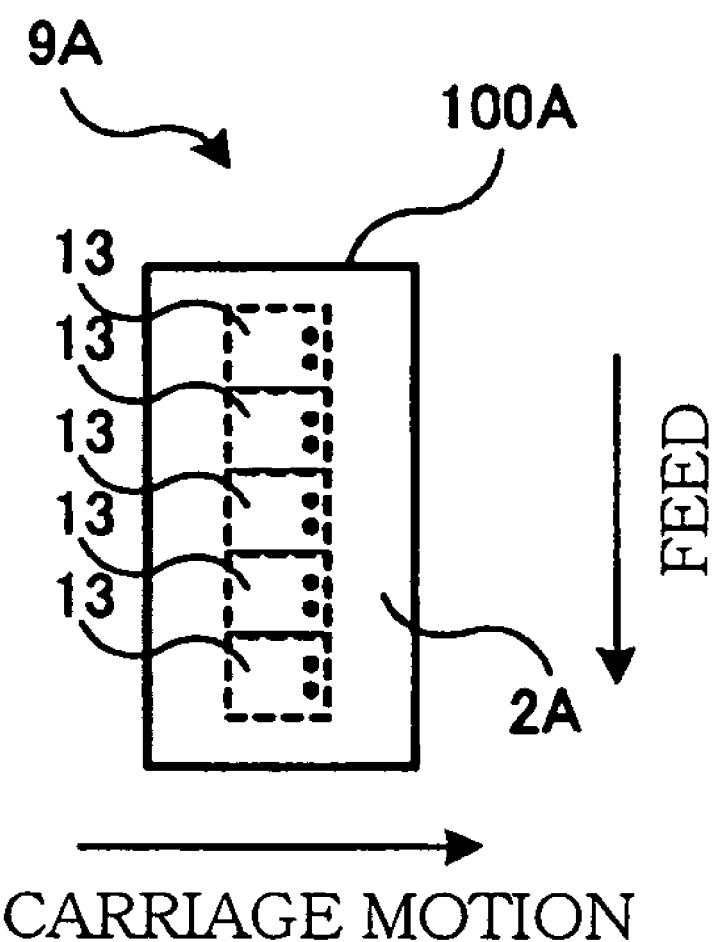
FIG. 11 is a general view showing an ejection face of a print head of a droplet ejection device constructed according to a second embodiment of the invention.

FIG. 11 is a general view showing an ejection face 2A of a main body 100A of the print head 9A. The print head 9A is a serial head which is elongated in a feed direction of the paper sheet 41 (indicated by arrow "FEED"), and is carried by a carriage (not shown) movable in a direction perpendicular to the feed direction of the paper sheet 41. That is, a desired pattern of image can be formed on the paper sheet 41, with ejection of the ink droplets onto the paper sheet 41 from the print head 9A which is moved in the direction perpendicular to the feed direction of the paper sheet 41.

The ejection face 2A of the main body 100A of the print head 9A is provided by a rectangular flat face which is elongated in the direction perpendicular to the feed direction of the paper sheet 41. The print head 9A has a multiplicity of ink ejection units 13 built in its main body 100A. The ink ejection units 13 are controlled by the controller 20A, to place the united ink droplets each having a desired volume, at desired positions on the paper sheet 41, and are arranged in the feed direction of the paper sheet 41, i.e., in the longitudinal direction of the main body 100A of the print head 9A. Each of the ink ejection units 13 has first and second ink ejecting portions 14a, 14b which are arranged in the longitudinal direction of the main body 100A of the print head 9A. It is noted that the first and second ink ejecting portions 14a, 14b are identical in construction with those of the above-described first embodiment.

Figure 12:
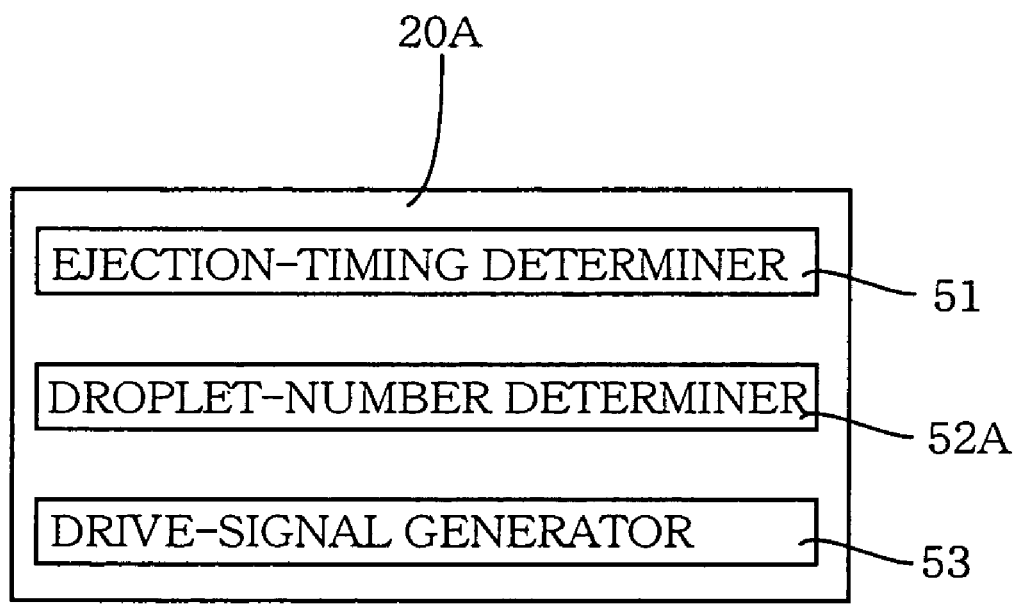
FIG. 12 is a block diagram showing functions of a controller provided for controlling the pint head of FIG. 11.

The controller 20A will be explained with reference to FIG. 12 which is a block diagram showing functions of the controller 20A. The controller 20A serves to control operations of components of the inkjet printer 1 such as the motor 44 and the inkjet head 9. In the present embodiment, the controller 20 includes a droplet-number determiner 52A in addition to the ejection-timing determiner 51 and the drive-signal generator 53. The ejection-timing determiner 51 serves to determine timing of ejections of the ink droplets from the ink ejecting portions 14a, 14b, such that the droplets ejected from the nozzles 8 of the respective first and second ink ejecting portions 14a, 14b collide to be united before landing on the paper sheet 41. The droplet-number determiner 52A serves to determine numbers of the ink droplets to be ejected from the respective first and second ink ejecting portions 14a, 14b per unit time, such that the united ink droplet is given a desired volume and is placed at a desired position on the paper sheet 41. The drive-signal generator 53 serves to generate drive signals on the basis of the determinations made by the ejection-timing determiner 51 and the droplet-number determiner 52A, and then outputs the drive signals to the individual electrodes 35 of the ink ejecting portions 14a, 14b. Each of the drive signals generated by the drive-signal generator 53 is provided by a pulse train having a generally rectangular waveform.

The controller 20A controls the reciprocating motion of the print head 9A, and at the same time controls the volume and placement of the united ink droplet ejected from each of the ink ejection units 13. In this instance, the volume of the united ink droplet is controlled on the basis of a desired grade of ink spot area, while the placement of the united ink droplet is controlled on the basis of a desired pattern of image and a position of each ink ejection unit 13 relative to the paper sheet 41.

There will be described an operation of each ink ejection unit 13 where the united ink droplet is given a variable volume, namely, where each ink ejection unit 13 is subjected to a control in accordance with an area gradation method. FIG. 13 is a table indicating a relationship among the numbers of the ink droplets ejected from the ink ejecting portions 14a, 14b of the ink ejection unit 13, the volumes of the ejected ink droplets and the landing position of the united ink droplet.

The constituent-droplet-number controller provided by the droplet-number determiner 52A and the drive-signal generator 53 controls a sum of the numbers of the ink droplets to be ejected from the first and second ink ejecting portions 14a, 14b of the ink ejection unit 13, so as to control the volume of the united ink droplet. By thus controlling the volume of the united ink droplet, it is possible to control an ink spot area defined by the united ink droplet placed at the predetermined position. In an example shown in the table of FIG. 13, the sum of the numbers of the ink droplets (each having a volume of 2 pl) ejected from the first and second ink ejecting portions 14a, 14b is four, eight or twelve (4, 8 or 12), so that the united ink droplet is given a volume of eight, sixteen or twenty-four (8, 16 or 24) pl. Thus, the ink spot area can be changed in a total of three steps, not counting a case where no ink droplet is ejected from the ink ejecting portions 14a, 14b, i.e., a case where the ink spot area is zero.

Figure 14:
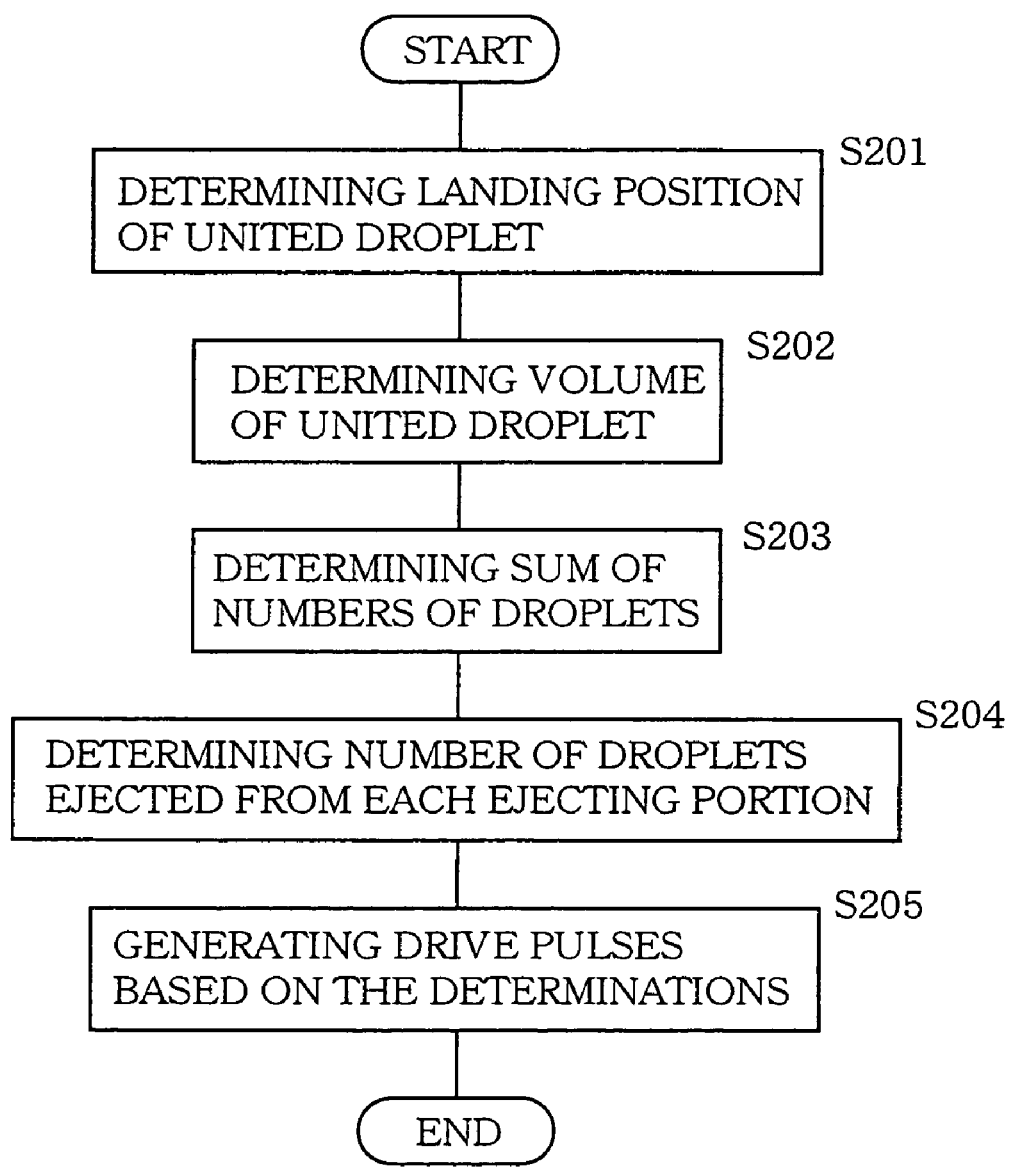
FIG. 14 is a flow chart showing an ink ejection control routine executed according to a control program stored in the controller of FIG. 12.

FIG. 14 is a flow chart illustrating an ink ejection control routine executed according to a control program stored in the controller 20A. This ink ejection control routine is initiated with a step S201 that is implemented to determine which one of the positions A-E the united ink droplet ejected from each of the ink ejection units 13 is to be placed at. Step S201 is followed by step S202 that is implemented to determine the volume of the united ink droplet on the basis of a desired grade of the ink spot area. In this instance, the volume V of the united ink droplet to be placed at the determined position is determined in accordance with the following expression:

$$V=(n-1)qk \qquad (3)$$

Where "n" represents the number of the positions, "q" represents the volume of each of the ink droplets ejected from the first and second ink ejecting portions 14a, 14b, and "k" represents the desired grade of the ink spot area.

In the present embodiment, the number "n" of the positions A-E is five (n=5), the volume "q" of each ink droplet is 2 pl (q=2), and the desired grade "k" of the ink spot area can be one, two or three (k=1, 2, 3). According to the above expression, the volume "V" of the united ink droplet is 16 pl, where the desired grade "k" of the ink spot area is two (k=2).

Step S203 is then implemented to determine the sum R of the numbers of the ink droplets that are to be ejected from the first and second ink ejecting portions 14a, 14b, on the basis of the volume V of the united ink droplet determined at step S202. In this instance, the sum "R" of the numbers of the ink droplets is determined in accordance with the following expression:

$$R=V/q \qquad (4)$$

According to the above expression, the sum "R" is 8, since the volume "q" of each ink droplet is 2 pl (q=2) while the volume "C" of the united ink droplet is 16 pl (V=16).

Step S203 is followed by step S204 in which the numbers of the ink droplets to be ejected from the respective first and second ink ejecting portions 14a, 14b are determined by the droplet-number determiner 52A of the controller 20, on the basis of the sum R and the landing position which are determined on the steps S203 and S201, respectively. In this instance, the number S1 of the ink droplets to be ejected from the first ink ejecting portion 14a and the number S2 of the ink droplets to be ejected from the second ink ejecting portion 14b are determined in accordance with the following expressions:

$$S1=(m-1)k \qquad (5)$$

$$S2=(n-m)k \qquad (6)$$

where "n" represents the number of the positions, and "m" represents the position of the determined one as counted from the left as seen in FIG. 5.

According to the above expressions, the numbers S1 and S2 are two and six, respectively (S1 =2, S2=6), since the landing position is the position B that is the second one as counted from the left (m=2), and the desired grade "k" of the ink spot area is two (k=2).

Then, the control flow goes to step S205 in which the drive-signal generator 53 generates drive pulses on the basis of the ejection timing determined by the ejection-timing determiner 51 and also the numbers S1, S2 determined at step S204. The generated drive pulses are outputted from the controller 20 to the ink ejecting portions 14a, 14b, which eject the ink droplets in response to the drive pulses.

Figure 15:
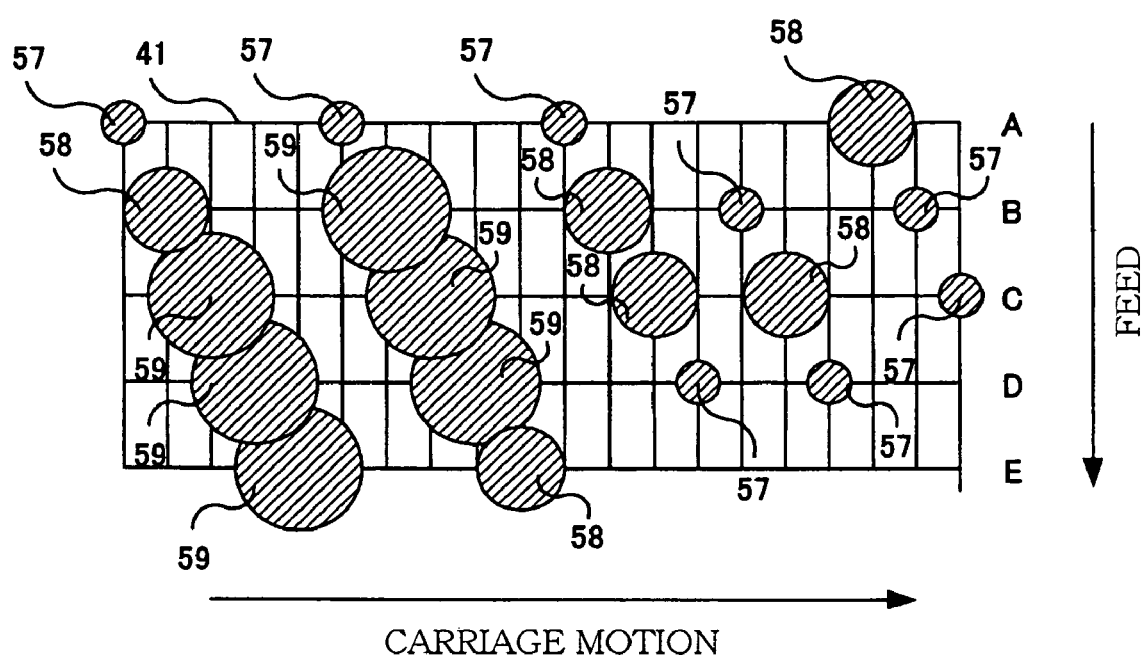
FIG. 15 is a view illustrating an example of placements of the united ink droplets made by the ejection unit of FIG. 11.

FIG. 15 is a view illustrating an example of placement of the united ink droplets performed by the ink ejection unit 13 in a printing operation in which the paper sheet 41 is fed in the feed direction indicated by arrow "FEED" while the print head 9A is moved by the carriage in the direction indicated by arrow "CARRIAGE MOTION". As is apparent from FIG. 15, a plurality of united ink droplets 57-59 are successively placed at desired positions on the paper sheet 41. A spacing distance between each adjacent pair of horizontal lines (parallel with the direction of the movement of the print head 9A) corresponds to the spacing distance between each adjacent pair of the positions A-E, while a spacing distance between each adjacent pair of vertical lines (perpendicular to the direction of the movement of the print head 9A) corresponds to a distance by which the print head 9A is moved after placement of each of the united ink droplets on the paper sheet 41. It is noted that the united ink droplets 57-59 have the respective volumes of 8 pl, 16 pl and 24 pl, respectively.

As shown in FIG. 15, the ink ejection unit 13 is controlled to place each of the united ink droplets 57-59 at a determined one of the five positions A-E. Each of the united ink droplets is constituted by a total of four, eight or twelve ink droplets each ejected from the first ink ejecting portion 14a or second ink ejecting portion 14b (see the table of FIG. 13). That is, the controller 20 controls the ink ejection unit 13 such that the ink spot area defined by each united ink droplet is variable in three steps. Further, irrespective of whether the ink ejection unit 13 is subjected to the gradation control or not, the ink ejection unit 13 having the two ink ejecting portions 14a, 14b is capable of printing an image in an area having substantially the same size (as measured in the feed direction of the paper sheet 41) as the ink ejection unit having five ink ejecting portions.

Like in the above-described first embodiment, in the second embodiment, a high resolution image can be formed even without arranging the nozzles 8 with high density in the main body 100A of the print head 9A, thereby permitting the print head 9A to be manufactured at a low cost. Further, since the ink ejection unit 13 is capable of printing an image in a wide area, it is possible to reduce the number of times of the reciprocating motions of the carriage carrying the print head 9A, thereby permitting a printing operation to be performed at a speed higher than a conventional serial head.

Further, in the second embodiment, it is possible to form an image with a desired gradation, by simply controlling the number of the ink droplets constituting the united ink droplet, namely, by simply controlling the volume of the united ink droplet.

Figure 16:
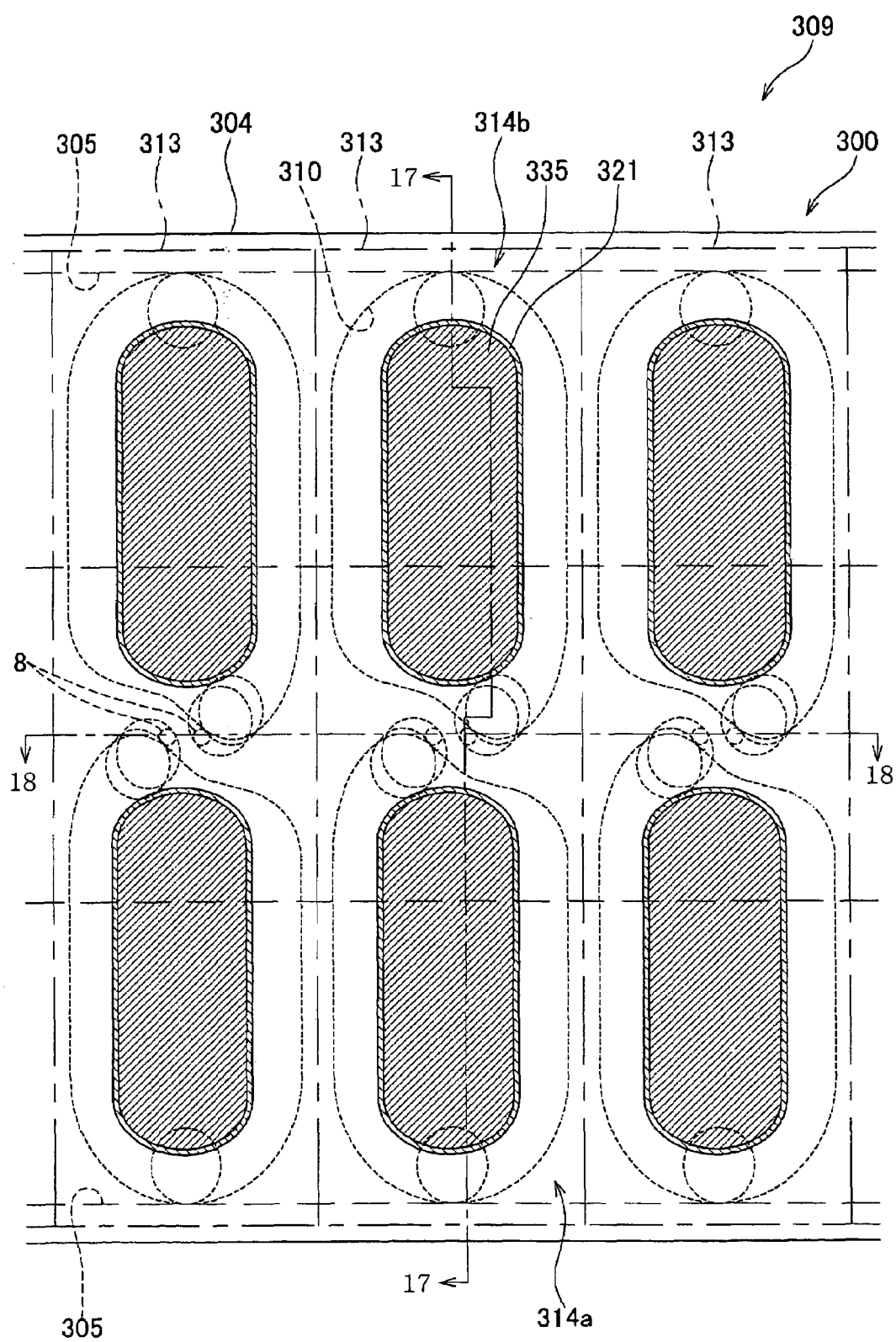
FIG. 16 is an enlarged plan view of a main body of a print head constructed according to a third embodiment of the invention.
Figure 17:
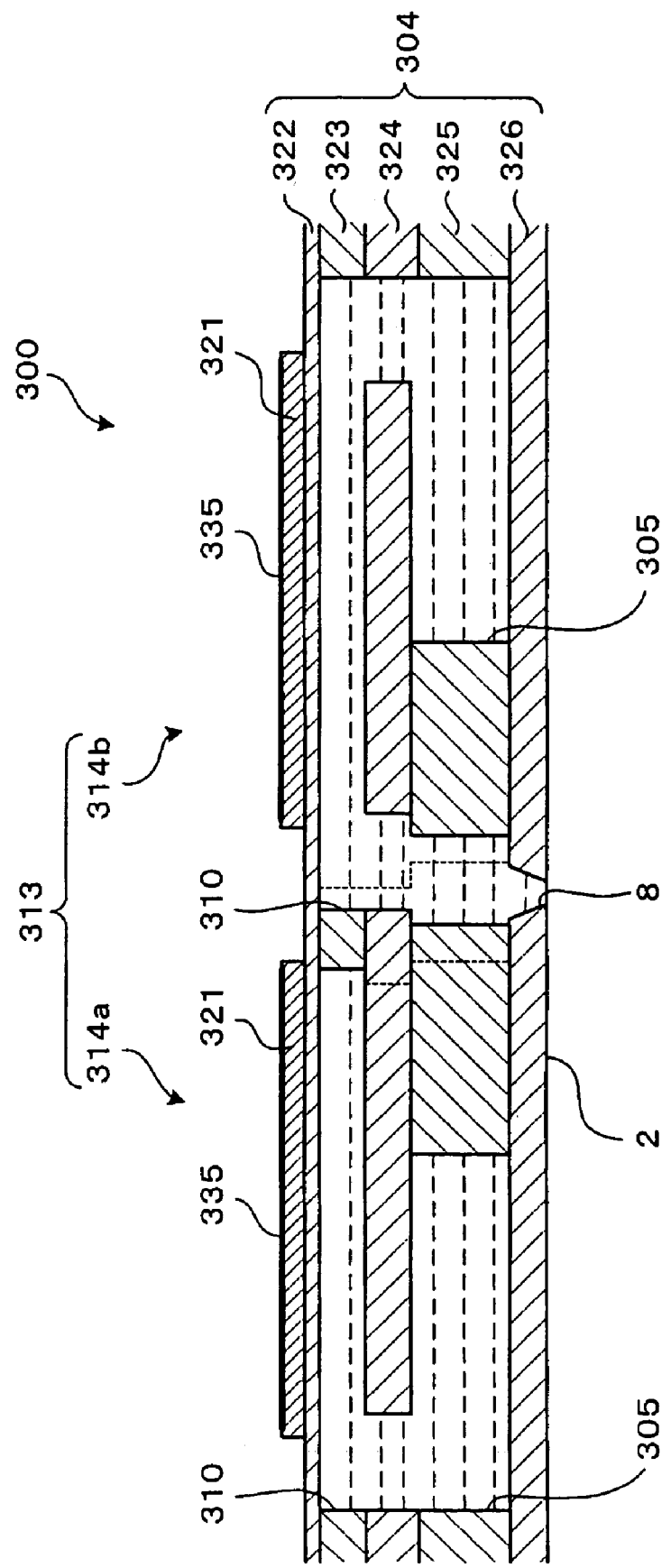
FIG. 17 is a view partly in cross section of the print head of FIG. 16, taken along line 17-17 of FIG. 16.
Figure 18:
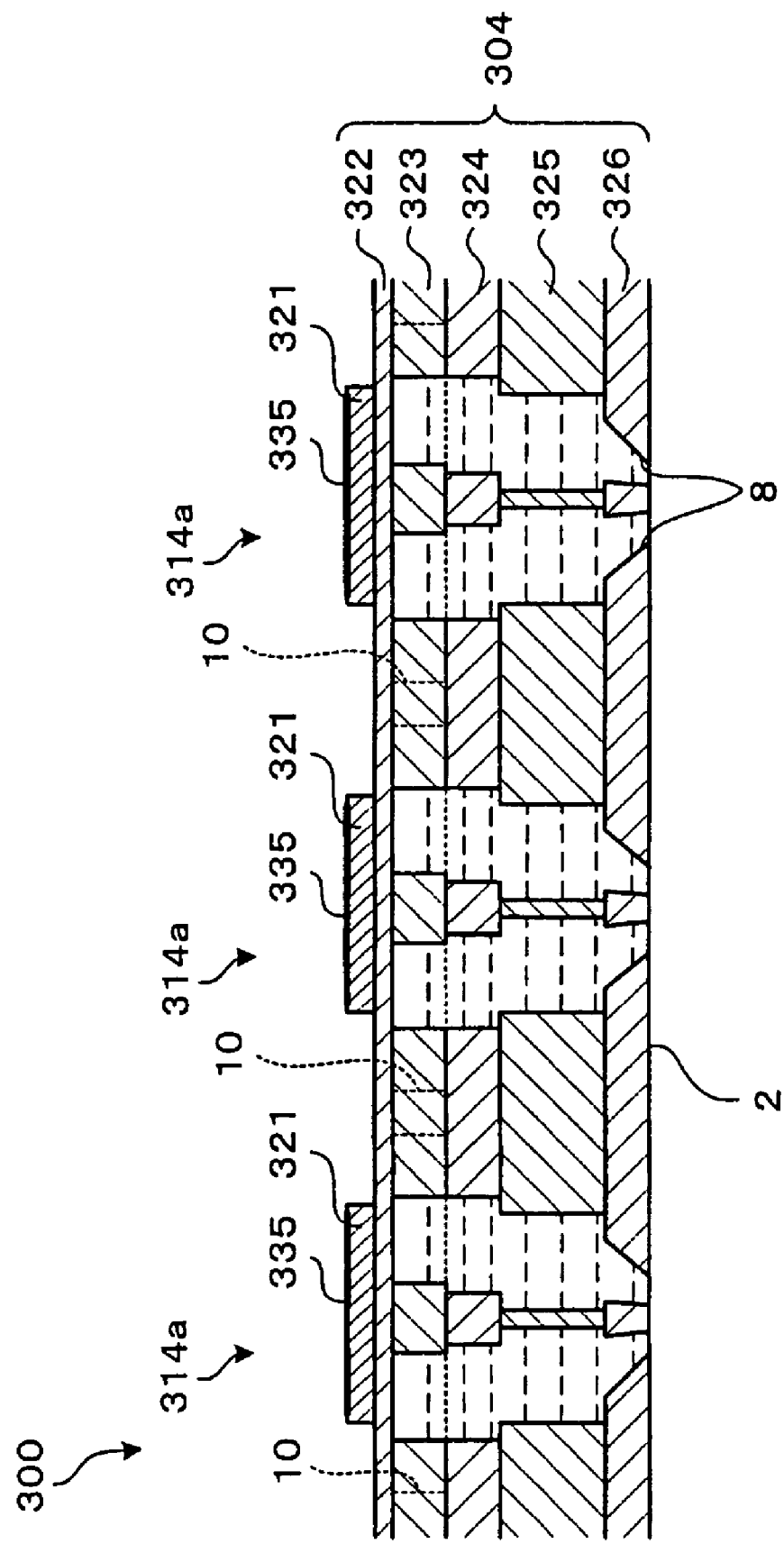
FIG. 18 is a view partly in cross section of the print head of FIG. 16, taken along line 18-18 of FIG. 16.

Referring next to FIGS. 16-27, there will be described a third embodiment of the invention. FIG. 16 is an enlarged plan view of a main body 300 of a print head 309 in this third embodiment. FIG. 17 is a view partly in cross section taken along line 17-17 of FIG. 16. FIG. 18 is a view partly in cross section taken along line 18-18 of FIG. 16. The third embodiment is substantially identical with the first embodiment, except for its print head 309 and controller 320 which will be described below.

Like the print head 9 in the first embodiment, the print head 309 is of a line type, and has the main body 300 having the ejection face 2 provided by a rectangular flat face. As shown in FIGS. 16-18, the print head 309 has a passage-defining unit 304, piezoelectric sheets 321 and individual electrodes 335 in its main body 300. The passage-defining unit 304 has a laminated structure constituted by a plurality of plates 322-326 which are laminated on each other. As shown in FIG. 16, the passage-defining unit 304 defines two manifold chambers 305 each of which is elongated in the longitudinal direction of the passage-defining unit 304, such that the manifold chambers 305 are located in widthwise opposite end portions of the passage-defining unit 304. The manifold chambers 305 are held in communication at their respective lengthwise opposite end portions (not shown) with each other. The passage-defining unit 304 has a multiplicity of communication passages defined by through-holes formed through the plates 323-326. The print head 309 has, in its main body 300, has a multiplicity of ink ejection units 313 which are constituted by the communication passages, the piezoelectric sheets 321 and the individual electrodes 335.

The ink ejection units 313 are connected to the controller 320 (which is substantially identical with the controller 20 of the first embodiment), so as to be controlled by the controller 320 such that the united ink droplet having a desired volume is placed at a desired position on the receiver medium. The ejection units 313 are arranged in the direction in which the main body 300 of the print head 309 is elongated. Each of the ejection units 13 has a pair of ink ejecting portions (first and second ink ejecting portions) 314a, 314b which are arranged in a direction perpendicular to the longitudinal direction of the main body 300 of the print head 309.

The first and second ink ejecting portions 314a, 314b of each ejection unit 313 are capable of ejecting the ink droplets, independently of each other. That is, the ejections of the ink droplets from the first and second ink ejecting portions 314a, 314b are made at respective points of time which can be either the same or different from each other. The ink droplets ejected from the first and second ink ejecting portions 14a, 14b are adapted to have respective velocities which can be either the same or different from each other. As shown in FIG. 16, the plurality of first ink ejecting portions 314a are arranged in a row which is parallel with the longitudinal direction of the main body 300 of the print head 309, while the plurality of second ink ejecting portions 314b are arranged in another row which is also parallel with the longitudinal direction of the main body 300 of the print head 309. Each pair of the ink ejecting portions 314a, 314b, arranged in a direction perpendicular to the longitudinal direction of the main body 300, constitute a corresponding one of the ejection units 313. That is, each ink ejection unit 313 is constituted by the corresponding pair of the ink ejecting portions 314a, 314b arranged in the direction perpendicular to the longitudinal direction of the main body 300 in the present third embodiment, while each ink ejection unit 13 is constituted by the corresponding pair of the ink ejecting portions 14a, 14b arranged in the longitudinal direction of the main body 100 in the first and second embodiments. Each of the first and second ink ejecting portions 314a, 314b has a corresponding one of the nozzles 8 and a pressure chamber 310 as a droplet chamber. Each of the nozzles 8 is provided by a tapered hole which is formed through the nozzle plate 326 such that its diameter is decreased as viewed in a direction away from an inside surface of the nozzle plate 326 toward an outside surface (i.e., the ejection face 2) of the nozzle plate 326. As shown in FIG. 17, each of the nozzles 8 is held in communication with a corresponding one of the above-described manifold chambers 305 through the pressure chamber 310. The plurality of nozzles 8 are arranged in the longitudinal direction of the main body 300 of the print head 309, and lie on a first straight line (corresponding to the line 18-18) as shown in FIG. 16. Further, the tapered holes providing the nozzles 8 of the first and second ink ejecting portions 314a, 314b have respective axes which are inclined with respect to each other by a predetermined angle such that trajectories described by the ink droplets ejected from the respective first and second ink ejecting portions 314a, 314b intersect each other in a space between the ejection face 2 and the paper sheet 41, as shown in FIG. 18.

To the manifold chambers 305, an ink is supplied via an ink supply port (not shown) formed in the end portion of the passage-defining unit 304. Since the manifold chambers 305 are held in communication at their respective end portions with each other, as described above, the ink can be constantly supplied to all the pressure chambers 310 through the manifold chambers 305 and the single ink supply port from an ink reservoir. As shown in FIG. 16, the passage-defining unit 304 defines the multiplicity of pressure chambers 310. Like in each of the above-described pressure chambers 10, in each of the pressure chambers 310 constituting a passage, the ink supplied through the corresponding manifold chamber 305 is pressurized so as to be ejected through the corresponding nozzle 8. The multiplicity of pressure chambers 310 are arranged in two rows which are parallel with the longitudinal direction of the passage-defining unit 304. Each of the pressure chambers 310 arranged in one of the two rows located on the lower part as seen in FIG. 16 is included in a corresponding one of the first ink ejecting portions 314a, while each of the pressure chambers 310 arranged in the other of the two rows located on the upper part as seen in FIG. 16 is included in a corresponding one of the second ink ejecting portions 314b. In other words, the plurality of first ink ejecting portions 314a are located on one of opposite sides of the above-described first straight line, and are arranged in the longitudinal direction of the main body 300 of the print head 309. Meanwhile, the plurality of second ink ejecting portions 314b are located on the other of the opposite sides of the first straight line, and are arranged in the longitudinal direction of the main body 300 of the print head 309. The pressure chambers 310 of the pair of ink ejecting portions 314a, 314b of each of the ink ejection units 313 are positioned relative to each other such that a second straight line (not shown) connecting centers of the pressure chambers 310 is perpendicular to the above-described first straight line. This arrangement permits the nozzles 8 to be arranged in the predetermined direction at a small pitch between each adjacent pair of the nozzles 8, even where each of the pressure chambers 310 has a large size. It is noted that the piezoelectric sheet 321 is located above a central portion of each of the pressure chambers 310, and has a plan configuration analogous to that of the pressure chamber 310, like the above-described piezoelectric sheet 21.

The piezoelectric sheets 321 and the individual electrodes 335 are formed of the same materials as those forming the above-described piezoelectric sheets 21 and the individual electrodes 335, and have the same functions as the piezoelectric sheets 21 and the individual electrodes 335. The individual electrodes 335 are connected to respective signal wires (not shown), which in turn are connected to the controller 320, so that an electric potential of each individual electrode 335 can be controlled by the controller 320 through the signal wires. It is noted that each of the piezoelectric sheets 321 and the actuator plate 322 cooperate with each other to constitute a so-called unimorph actuator, like the piezoelectric sheets 21 and the actuator plate 22.

Figure 19:
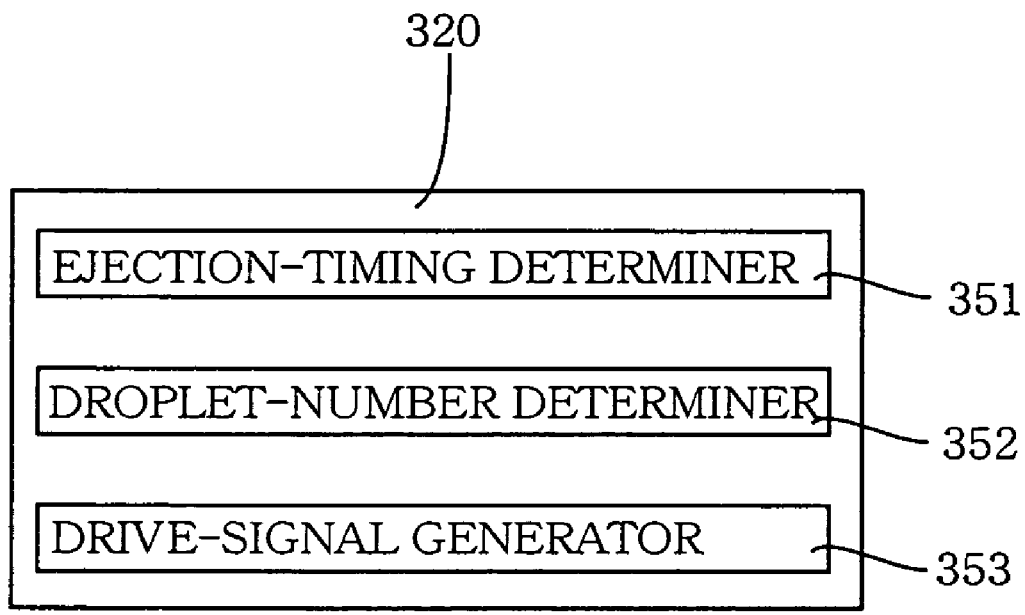
FIG. 19 is a block diagram showing functions of a controller provided for controlling the pint head of FIG. 16.

FIG. 19 is a block diagram showing functions of the controller 320 which controls operations of components of the inkjet printer 1 such as the motor 44 and the inkjet head 309. In the present third embodiment, the controller 20 includes an ejection-timing determiner 351, a droplet-number determiner 352 and a drive-signal generator 353. The ejection-timing determiner 351 serves to determine points of time at which the ink droplets are to be ejected from the ink ejecting portions 314a, 314b, such that the droplets ejected from the nozzles 8 of the respective first and second ink ejecting portions 314a, 314b collide to be united before landing on the paper sheet 41. The droplet-number determiner 52 serves to determine numbers of the ink droplets to be ejected from the respective first and second ink ejecting portions 314a, 314b per unit time, such that the united droplet has a desired volume and such that the united droplet is placed at a desired position on the paper sheet 41. The drive-signal generator 53 serves to generate drive signals on the basis of the determinations made by the ejection-timing determiner 351 and the droplet-number determiner 352, and then outputs the drive signals to the individual electrodes 35 of the ink ejecting portions 314a, 314b. Each of the drive signals generated by the drive-signal generator 353 is provided by a pulse train having a generally rectangular waveform. The controller 320 controls the volume and placement of the united ink droplet ejected from each of the ink ejection units 313. In this instance, the volume of the united ink droplet is controlled on the basis of a desired level of ink spot area, while the placement of the united ink droplet is controlled on the basis of a desired pattern of image and a position of each ink ejection unit 13 relative to the paper sheet 41.

Figure 20:
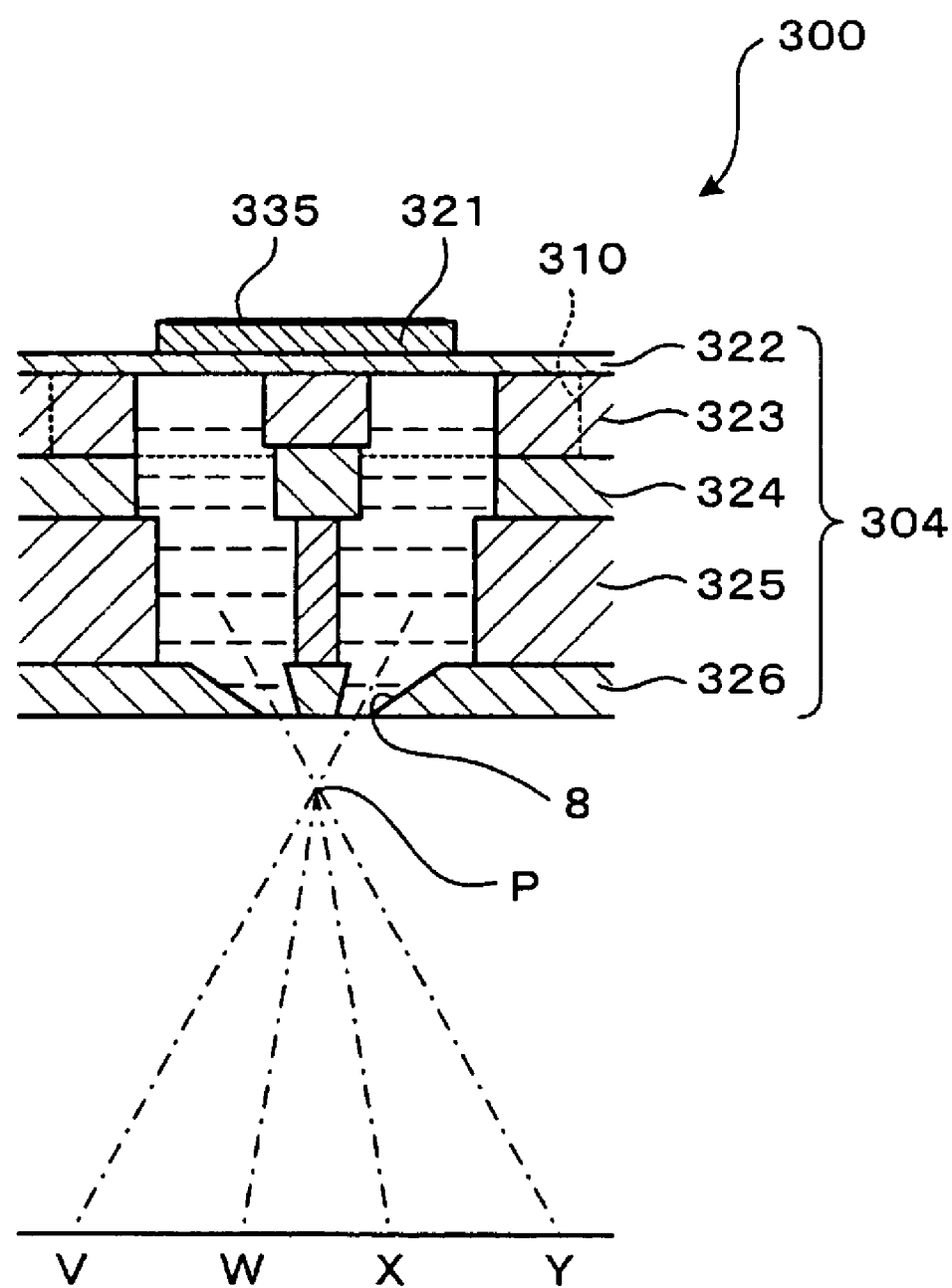
FIG. 20 is a view showing positions at which a united ink droplet (formed of ink droplets ejected from the ejection unit of FIG. 16) is to be placed.

There will next be described an operation of each ink ejection unit 313, with reference to FIGS. 20 and 21. FIG. 20 is a view showing positions at which the united ink droplet is to be placed.

The controller 320 controls, prior to an ink ejection command, an electric circuit such that a predetermined voltage is applied between the individual electrode 335 and the actuator plate 322, so that the piezoelectric sheet 321 and the actuator plate 222 (which are adjacent to each other) are deformed to be convexed toward the pressure chamber 310, whereby a volume of the pressure chamber 310 is reduced. That is, as the inkjet printer 1 is brought into in its ready state with its power source being turned ON, the predetermined voltage is applied to the individual electrode 335, for reducing the volume of the pressure chamber 310. Each time the controller 320 receives the ejection command, the controller 320 controls the electric circuit such that the voltage between the individual electrode 335 and the actuator plate 322 is reduced to a ground level, so that the deformed piezoelectric sheet 321 and actuator plate 322 restore their original flat shapes. The controller 320 then controls the electric circuit such that the voltage applied to the individual electrode 335 is increased to the predetermined level at a predetermined point of time, so that the piezoelectric sheet 321 and the actuator plate 322 are newly deformed to be convexed toward the pressure chamber 310, thereby increasing the pressure in the pressure chamber 310. The pressure increase in the pressure chamber 310 causes the ink to be ejected from the pressure chamber 310 through the nozzle 8.

As shown in FIG. 20, the controller 320 controls the ink ejection unit 313 such that the ink droplet or droplets ejected from the nozzle 8 of the first ink ejecting portion 314a and the ink droplet or droplets ejected from the nozzle 8 of the second ink ejecting portion 314b meet at or in the vicinity of an intersection P (at which the trajectories described by the ink droplets ejected from the respective first and second ink ejecting portions 14a, 14b intersect), so that the united ink droplet is then placed at a desired one of positions V-Y on the receiver medium. The droplet-number determiner 352 of the controller 320 determines the number of the ink droplets to be ejected from the respective first and second ink ejecting portions 314a, 314b per unit time, in view of the desired one of the positions V-Y at which the united ink droplet is to be placed. In other words, the droplet-number determiner 352 determines, in view of the desired one of the positions V-Y, a ratio between the number of the ink droplets to be ejected from the first ink ejecting portion 314a and the number of the ink droplets to be ejected from the second ink ejecting portion 314b. For example, the above-described ratio is set to be 0:3 so that the united ink droplet is placed at the position V. The ratio is set to be 1:2, for placement of the united ink droplet at the position W. The ratio is set to be 2:1, for placement of the united ink droplet at the position X. The ratio is set to be 3:0, for placement of the united ink droplet at the position Y.

Figure 21:
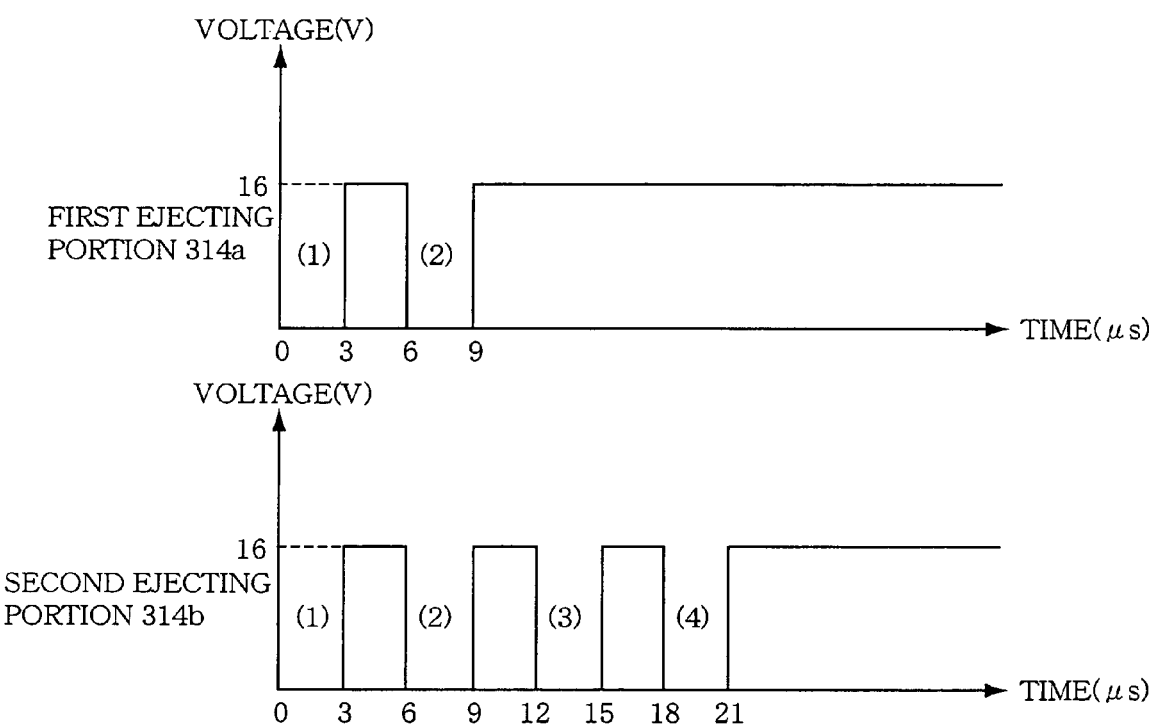
FIG. 21 is a graph showing waveforms of drive signals applied to the ejection unit of FIG. 16 in an example of operation for placing the united ink droplet in the position W.

FIG. 21 is a graph showing waveforms of the drive signals supplied from the controller 320 to the first and second ink ejecting portions 314a, 314b of the ink ejection unit 313, in an example of operation for placing the united ink droplet in the position W. In the graph of FIG. 21, the vertical axis represents the voltage applied between the individual electrode 335 and the actuator plate 322, while the horizontal axis represents a length of time having elapsed after a point of time at which the applied voltage is reduced to the ground level for allowing the deformed piezoelectric sheet 321 and actuator plate 322 to restore their original flat shapes. As shown in the graph of FIG. 21, two consecutive drive pulses (1), (2) are outputted from the drive-signal generator 353 of the controller 320 to the individual electrode 335 of the first ink ejecting portion 314a, while four consecutive drive pulses (1)-(4) are outputted from the drive-signal generator 353 of the controller 320 to the individual electrode 335 of the second ink ejecting portion 314b, such that the pulse width and separation both correspond to AL. In this pulse arrangement, each ink droplet is given a larger velocity than the preceding ink droplet, so that the six ink droplets ejected from the first and second ink ejecting portions 314a, 314b all meet at or in the vicinity of the above-described intersection P, so as to be united to constitute the united droplet, before landing on the receiver medium.

Table 1 indicates data in the example of the operation in which the drive signals shown in FIG. 21 are supplied to the first and second ink ejecting portions 314a, 314b. Described specifically, Table 1 indicates width, voltage, timing of leading edge of each of the drive pulses for the successive ejections, a velocity of the ink droplet ejected by each drive pulse, a length of time required for the ejected ink droplet to reach the intersection P, a point of time at which the ejected ink droplet reaches the intersection P, and a volume of the ejected ink droplet. It is noted that this example of the operation was performed under a condition as specified below.

[Condition]
Distance from nozzle 8 of each ink ejecting portion to intersection
P: 0.2 mm
Diameter of nozzle 8 at its distal end portion: 18 μm
Angle of inclination of nozzle 8 with respect to the vertical direction: 3.6°
AL in each ink ejecting portion: 3.0 μs
Spacing pitch between nozzles 8 in each ink ejecting portion:

169.3 μm (150 dpi)
Distance from nozzle 8 to paper sheet: 1 mm
Spacing pitch between positions V, W, X, Y: 42.3 μm (600 dpi)

TABLE 1

| | Pulse width (μs) | Voltage of pulse (V) | Timing of pulse leading edge (μs) | Velocity of ejected droplet (m/s) | Length of time for reaching intersection (μs) | Point of time at reaching intersection (μs) | Volume of droplet (pl) |
|---|---|---|---|---|---|---|---|
| First ejecting portion 314a | | | | | | | |
| 1st | 3 | 16.0 | 0 | 4.0 | 50.0 | 50.0 | 2.0 |
| 2nd | 3 | 16.0 | 6 | 4.8 | 41.7 | 47.7 | 2.1 |
| Second ejecting portion 314b | | | | | | | |
| 1st | 3 | 16.0 | 0 | 4.0 | 50.0 | 50.0 | 2.0 |
| 2nd | 3 | 16.0 | 6 | 4.8 | 41.7 | 47.7 | 2.1 |
| 3rd | 3 | 16.0 | 12 | 5.4 | 37.0 | 49.0 | 2.2 |
| 4th | 3 | 16.0 | 18 | 5.7 | 35.1 | 53.1 | 2.2 |

As is apparent from Table 1, the ratio between the number of the droplets ejected from the first ejecting portion 314a and the number of the droplets ejected from the second ejecting portion 314b is 2:4 (1:2). The droplets ejected from the respective first and second ink ejecting portions 314a, 314b concurrently with each other have the same volume and velocity. The droplet second ejected from the first ink ejecting portion 314a is given a larger velocity than that of the droplet first ejected from the first ink ejecting portion 314a. The droplet fourth ejected from the second ink ejecting portion 314b is given a larger velocity than those of the other droplets previously ejected from the second ink ejecting portion 314b. That is, each droplet is given a larger velocity than the preceding droplet, and catches up with the preceding droplet, before landing on the receiver medium, owing to an arrangement in which a time interval between a trailing edge of a drive pulse (i.e., a transition from the second voltage-level region to the first voltage-level region) and a trailing edge of the succeeding drive pulse (i.e., the succeeding transition from the second voltage-level region to the first voltage-level region) is arranged to correspond to 2AL (twice the acoustic length AL). This arrangement enables a pressure wave generated for the ejection of each ink droplet, to be synchronized with a residual pressure wave that is another pressure wave generated for the ejection of the preceding ink droplet, whereby the consecutively generated pressure waves are superimposed on each other. It is noted that the successively ejected droplets have slightly different volumes as indicated in Table 1. However, the difference therebetween is a tolerably small amount.

As is gathered from Table 1, a second one of the two successive droplets from the first ejecting portion 314a is ejected 6 μs after the ejection of a first one of the two successive droplets. However, the second one reaches the intersection P earlier than the first one, since the length of time required for the second one to reach the intersection P is smaller than the length of time required for the first one to reach the intersection P by about 8.3 μs. On other hand, a second one of the four successive droplets from the second ejecting portion 314b is ejected 6 μs after the ejection of a first one of the four successive droplets. A third one of the four successive droplets is ejected 12 μs after the ejection of the first one. A fourth one of the four successive droplets is ejected 18 μs after the ejection of the first one. The second and third ones reach the intersection P earlier than the first one, since the lengths of time required for the second and third ones to reach the intersection P are smaller than the length of time required for the first one to reach the intersection P by about 8.3 μs and 13.0 μs, respectively. The fourth one reaches the intersection P a little later than the first one, although the fourth one is given a velocity much higher than that of the first one. That is, the ejection delay is not completely compensated by the high velocity. However, since a difference between a point of time at which the first one reaches the intersection P and a point of time at which the fourth one reaches the intersection P is so small as 3.1 μs, the fourth one can be brought into contact with the first, second and third ones in the vicinity of the intersection P, so as to be united with the three preceding ones. Thus, the ink droplets ejected from the first and second droplet ejecting portions 314a, 314b are united with each other at or in the vicinity of the intersection P, and then constitute the united ink droplet. The united ink droplet then lands on the position W which is located between the positions V, Y and which is distant from the position Y by a distance equal to two-thirds of the distance between the positions V and Y.

Figure 22:
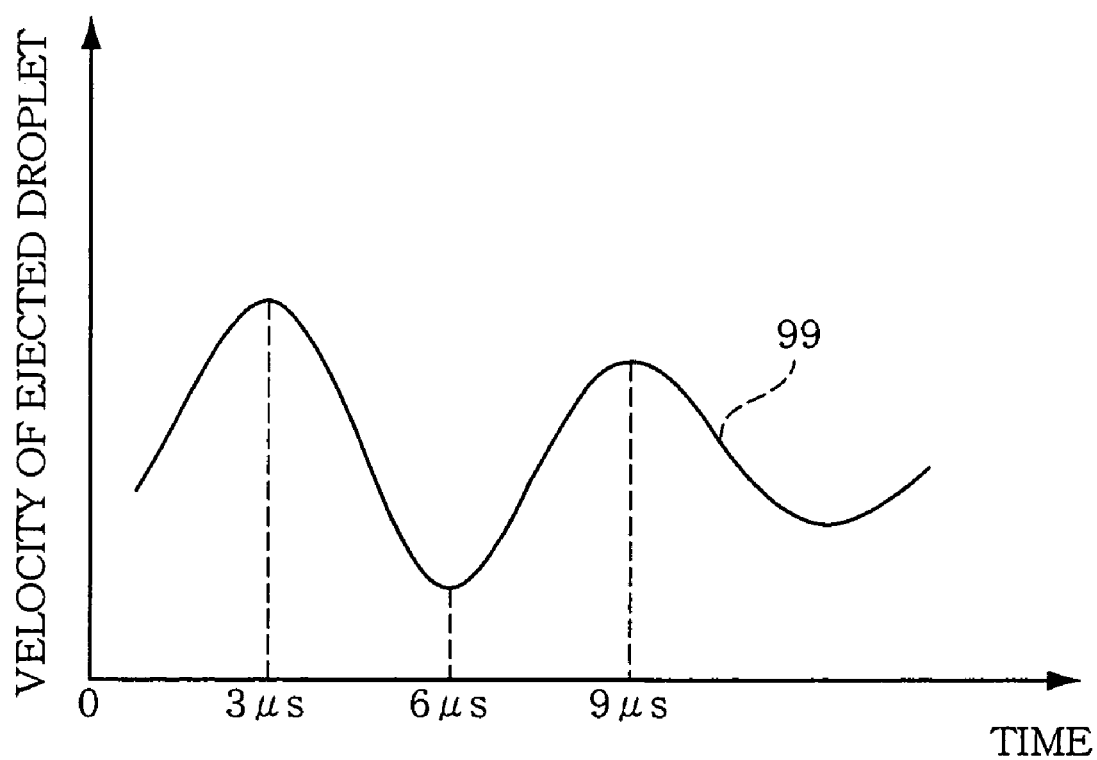
FIG. 22 is a graph showing a relationship between an ejection timing of the ink droplet and a velocity of the ejected ink droplet.

FIG. 22 is a graph showing a relationship between an ejection timing of the ink droplet and a velocity of the ejected ink droplet. In this graph, the horizontal axis represents a length of time having elapsed after a point of time at which the applied voltage is reduced to the ground level (for allowing the deformed piezoelectric sheet 321 and actuator plate 322 to restore their original flat shapes), while the vertical axis represents a velocity of the ink droplet which is ejected by increasing the applied voltage to the predetermined level (for allowing the piezoelectric sheet 321 and actuator plate 322 to be convexed toward the pressure chamber 310) at the corresponding point of time. The width and separation of the drive pulses outputted to the individual electrodes 335 are determined on the basis of a curve 99, which is described in the graph so as to represent the above-described relationship. The change in the volume of the pressure chamber 310 causes a pressure wave which is propagated between the manifold chamber 305 and the nozzle 8 through the pressure chamber 310. As indicated by the curve 99, the velocity of the ink droplet is maximized in a case where the applied voltage is increased to the predetermined level when 3 μs has elapsed after the above-described point of time. The velocity of the ink droplet is minimized in a case where the applied voltage is increased to the predetermined level when 6 μs has elapsed after the above-described point of time. In other words, the velocity of the ink droplet is gradually increased in a section between 0 μs and 3 μs, decreased in a section between 3 μs and 6 μs, and newly increased in a section between 6 μs and 9 μs. A time interval between the peak and bottom points corresponds to AL, namely, a length of time for the pressure wave to be propagated from the manifold chamber 305 to the nozzle 8 via the pressure chamber 310 or a length of time for the pressure wave to be propagated from the nozzle 8 to the manifold chamber 305 via the pressure chamber 310. The time interval remains unchanged although the velocity fluctuation is gradually reduced as the time passes.

In view of the above-described relationship represented by the curve 99, the pulse width and separation are set to be AL, so that a time interval between a trailing edge of a drive pulse and a trailing edge of the succeeding drive pulse corresponds to 2AL, whereby the point of time of the ink ejection can be coincident with the peak point, thereby permitting the ejected ink droplet to have a maximum velocity. That is, with a pulse train having such a time interval between the trailing edges of the drive pulses being applied to each of the individual electrodes 335 of the ink ejecting portions 314a, 314b, a pressure wave generated for the ejection of each ink droplet is synchronized with a residual pressure wave or waves generated for the ejection of the preceding ink droplet or droplets, whereby the consecutively generated pressure waves are superimposed on each other. Therefore, the currently ejected ink droplet is given a larger velocity than the previously ejected ink droplet, and catches up with the previously ejected ink droplet, so that the ink droplets are united with each other, before landing on the receiver medium. In the example shown in FIG. 21, the drive signal supplied from the controller 320 to each of the individual electrodes 335 of the first and second ejecting portions 314a, 314b is provided by the pulse train in which the pulse width and separation are both 3 μs corresponding to AL. Since the pulse width corresponds to AL, namely, since each of the second voltage-level regions has a time length corresponding to AL, a pressure in the vicinity of the nozzle 8 is switched from its negative state to positive state (according to the pressure fluctuation induced as a result of the increase in the volume of the pressure chamber 310 with the reduction of the above-described applied voltage to the ground level), concurrently with an increase in the pressure in the vicinity of the nozzle 8 as a result of the reduction in the volume of the pressure chamber 310 with the increase of the applied voltage to the predetermined level. In other words, a pressure increase caused by the ink delivery to the pressure chamber 10 and a pressure increase caused by the reduction in the volume of the pressure chamber 10 coincide with each other, thereby making it possible to increase a velocity of the ejected ink droplet.

In the example shown in FIG. 21, each ink droplet is given a larger velocity than the preceding ink droplet, by the arrangement in which the pressure wave generated for the ejection of each ink droplet is synchronized with the residual pressure wave generated for the ejection of the preceding ink droplet, as described above. However, it is possible to give each ink droplet a larger velocity than the preceding ink droplet, by other arrangements as in first and second modifications which are described below.

Figure 23:
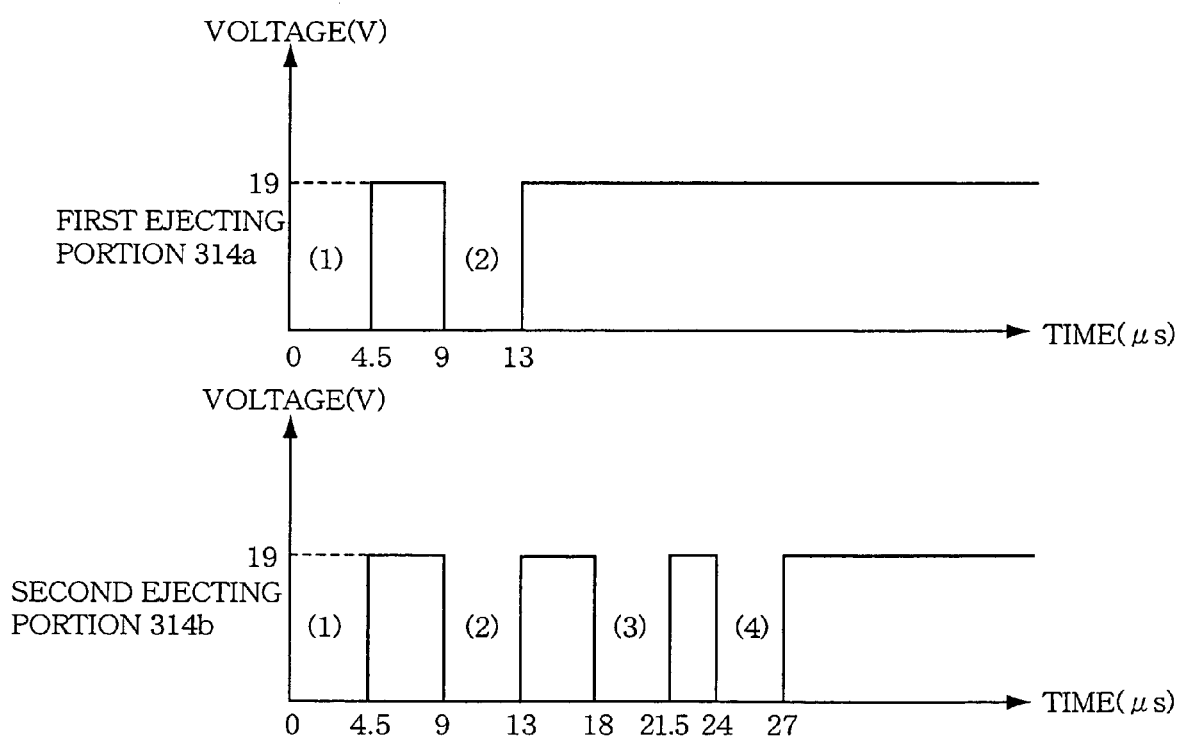
FIG. 23 is a graph showing waveforms of drive signals applied to the ejection unit of FIG. 16 in a first modification of the above-described example of the operation shown in FIG. 21.

FIG. 23 is a graph showing waveforms of the drive signals supplied to the first and second ink ejecting portions 314a, 314b in the first modification of the operation for placing the united ink droplet in the position W. In the graph of FIG. 23, the vertical axis represents the voltage applied between the individual electrode 335 and the actuator plate 322, while the horizontal axis represents a length of time having elapsed after a point of time at which the applied voltage is reduced to the ground level for allowing the deformed piezoelectric sheet 321 and actuator plate 322 to restore their original shapes. In this first modification, each of the drive signals is provided by a pulse train in which each second voltage-level region has a length of time closer to AL than the preceding second voltage-level region, namely, the pulse width is gradually approximated to AL, so that each ink droplet is given a larger velocity than the preceding ink droplet. Table 2 indicates width, voltage, timing of leading edge of each of the drive pulses for the successive ejections, a velocity of the ink droplet ejected by each drive pulse, a length of time required for the ejected ink droplet to reach the intersection P, a point of time at which the ejected ink droplet reaches the intersection P, and a volume of the ejected ink droplet. It is noted that this first modification of the operation was performed under the same condition as specified above.

TABLE 2

| | Pulse width (μs) | Voltage of pulse (V) | Timing of pulse leading edge (μs) | Velocity of ejected droplet (m/s) | Length of time for reaching intersection (μs) | Point of time at reaching intersection (μs) | Volume of droplet (pl) |
|---|---|---|---|---|---|---|---|
| First ejecting portion 314a | | | | | | | |
| 1st | 4.5 | 19.0 | 0 | 4.0 | 50.0 | 50.0 | 2.0 |
| 2nd | 4 | 19.0 | 9 | 5.1 | 39.2 | 48.2 | 2.2 |
| Second ejecting portion 314b | | | | | | | |
| 1st | 4.5 | 19.0 | 0 | 4.0 | 50.0 | 50.0 | 2.0 |
| 2nd | 4 | 19.0 | 9 | 5.1 | 39.2 | 48.2 | 2.2 |
| 3rd | 3.5 | 19.0 | 18 | 6.0 | 33.3 | 51.3 | 2.3 |
| 4th | 3 | 19.0 | 24 | 6.7 | 29.9 | 53.9 | 2.4 |

As is apparent from FIG. 23 and Table 2, the first and second drive pulses outputted to the individual electrode 335 of the first ink ejecting portion 314a for the first and second ejections of the ink droplets have widths of 4.5 μs and 4 μs, respectively. On the other hand, the first, second, third and fourth drive pulses outputted to the individual electrode 335 of the second ink ejecting portion 314b for the first, second, third and fourth ejections of the ink droplets have widths of 4.5 μs, 4 μs, 3.5 μs and 3 μs, respectively. In each of the first and second ink ejecting portions 314a, 314b in which AL corresponds to 3.0 μs, the velocity of the ink droplet is gradually decreased in the section between 3 μs and 6 μs, as the time passes, as discussed above with reference to FIG. 22. Therefore, each ink droplet ejected from a corresponding one of the first and second ink ejecting portions 314a, 314b is given a larger velocity than the preceding ink droplet, as shown in Table 2, so that the ink droplets ejected from the two ink ejecting portions 314a, 314b can be united at or in the vicinity of the intersection P. As is gathered from Table 2, since the ink droplet second ejected from each of the first and second ink ejecting portions 314a, 314b reaches the intersection P earlier than the first ejected ink droplet, by 1.8 μs, the first and second ejected ink droplets are united with each other, before the first ink droplet reaches the intersection P. The ink droplets third and fourth ejected from the second ink ejecting portion 314b reach the intersection P later than the ink droplet first ejected from the second ink ejecting portion 314b, by 1.3 μs and 3.9 μs, respectively, although the third and fourth ejected ink droplets are given velocities much higher than that of the first ejected ink droplet. However, since such time differences are small, the third and fourth ejected ink droplets can be brought into contact with the first and second ejected ink droplets in the vicinity of the intersection P, so as to be united with the two preceding ink droplets. It is noted that the successively ejected droplets have slightly different volumes as indicated in Table 2. However, the difference therebetween is a tolerably small amount.

In the above-described second modification, the first one of the successive drive pulses has the width of 4.5 μs, while the final one of the successive drive pulses has the width of 3 μs. Namely, in the second modification, the pulse width is changed or modulated within a range between 4.5 μs and 3 μs, such that the pulse width is gradually approximated to 3 μs as the time passes. However, the pulse width may be modulated within a range other than the range between 4.5 μs and 3 μs, as long as each drive pulse has a width closer to AL than the preceding drive pulse.

Figure 24:
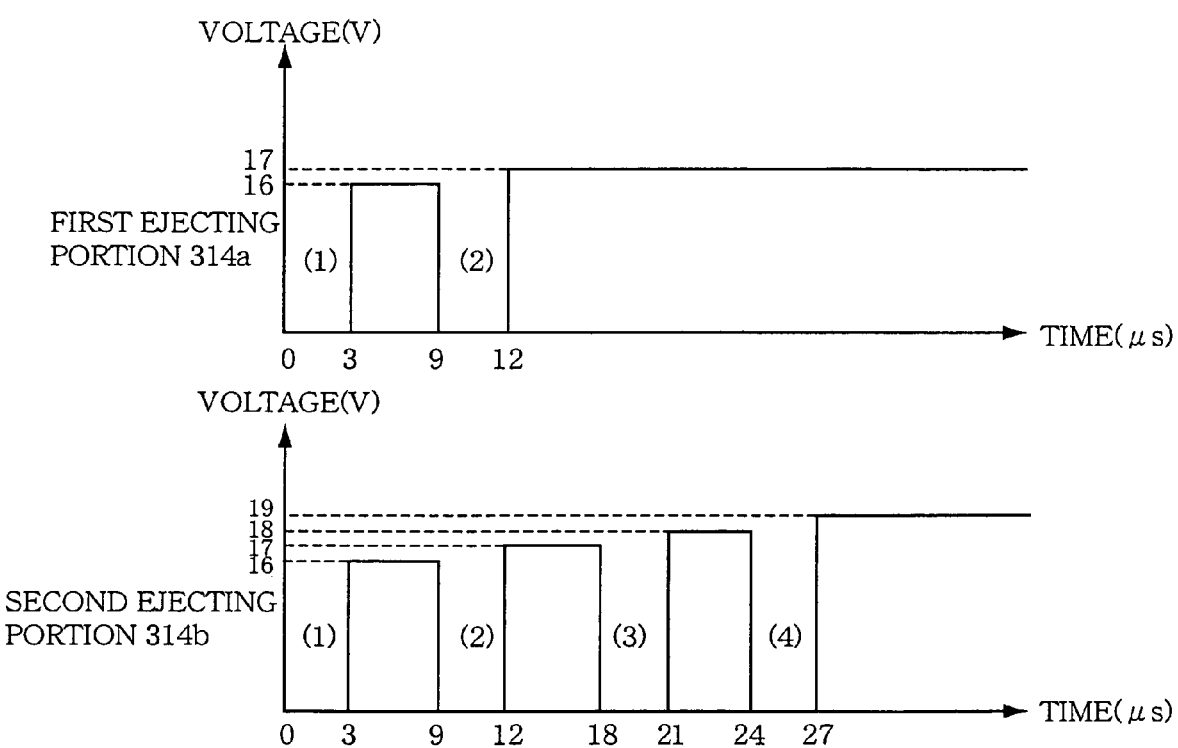
FIG. 24 is a graph showing waveforms of drive signals applied to the ejection unit of FIG. 16 in a second modification of the above-described example of the operation shown in FIG. 21.

FIG. 24 is a graph showing waveforms of the drive signals supplied to the first and second ink ejecting portions 314a, 314b in the second modification of the operation for placing the united ink droplet in the position W. In the graph of FIG. 24, the vertical axis represents the voltage applied between the individual electrode 335 and the actuator plate 322, while the horizontal axis represents a length of time having elapsed after a point of time at which the applied voltage is reduced to the ground level for allowing the deformed piezoelectric sheet 321 and actuator plate 322 to restore their original flat shapes. In this second modification, each of the drive signals is provided by a pulse train in which a voltage difference between each adjacent pair of the first and second voltage-level regions is larger than a voltage difference between the preceding adjacent pair of the first and second voltage-level regions, namely, each drive pulse has a higher voltage than the preceding drive pulse, so that each ink droplet is given a larger velocity than the preceding ink droplet. Table 3 indicates width, voltage, timing of leading edge of each of the drive pulses for the successive ejections, a velocity of the ink droplet ejected by each drive pulse, a length of time required for the ejected ink droplet to reach the intersection P, a point of time at which the ejected ink droplet reaches the intersection P, and a volume of the ejected ink droplet. It is noted that this second modification of the operation was performed under the same condition as in the above-described first modification.

TABLE 3

| | Pulse width (μs) | Voltage of pulse (V) | Timing of pulse leading edge (μs) | Velocity of ejected droplet (m/s) | Length of time for reaching intersection (μs) | Point of time at reaching intersection (μs) | Volume of droplet (pl) |
| --- | --- | --- | --- | --- | --- | --- | --- |
| First ejecting portion 314a | | | | | | | |
| 1st | 3 | 16.0 | 0 | 4.0 | 50.0 | 50.0 | 2.0 |
| 2nd | 3 | 17.0 | 9 | 4.9 | 40.9 | 49.9 | 2.1 |
| Second ejecting portion 314b | | | | | | | |
| 1st | 3 | 16.0 | 0 | 4.0 | 50.0 | 50.0 | 2.0 |
| 2nd | 3 | 17.0 | 9 | 4.9 | 40.9 | 49.9 | 2.1 |
| 3rd | 3 | 18.0 | 18 | 5.8 | 34.6 | 52.6 | 2.3 |
| 4th | 3 | 19.0 | 24 | 6.7 | 29.9 | 53.9 | 2.4 |

As is apparent from FIG. 24 and Table 3, the first and second drive pulses outputted to the individual electrode 335 of the first ink ejecting portion 314a for the first and second ejections of the ink droplets have voltages of 16 V and 17 V. On the other hand, the first, second, third and fourth drive pulses outputted to the individual electrode 335 of the second ink ejecting portion 314b for the first, second, third and fourth ejections of the ink droplets have voltages of 16 V, 17 V, 18 V and 19 V. By thus gradually increasing the voltage applied between the individual electrode 335 and the actuator plate 322, it is possible to change the volume of the pressure chamber 310 by a larger amount in each ejection of the ink droplet, than in the preceding ejection of the ink droplet. Therefore, each ink droplet ejected from a corresponding one of the first and second ink ejecting portions 314a, 314b is given a larger velocity than the preceding ink droplet, as shown in Table 3, so that the ink droplets ejected from the two ink ejecting portions 314a, 314b can be united at or in the vicinity of the intersection P. As is gathered from Table 3, since the ink droplet second ejected from each of the first and second ink ejecting portions 314a, 314b reaches the intersection P earlier than the first ejected ink droplet, by 0.1 μs, the first and second ejected ink droplets are united with each other, before the first ink droplet reaches the intersection P. The ink droplets third and fourth ejected from the second ink ejecting portion 314b reach the intersection P later than the ink droplet first ejected from the second ink ejecting portion 314b, by 2.6 μs and 3.9 μs, respectively, although the third and fourth ejected ink droplets are given velocities much higher than that of the first ejected ink droplet. However, since such time differences are small, the third and fourth ejected ink droplets can be brought into contact with the first and second ejected ink droplets in the vicinity of the intersection P, so as to be united with the two preceding ink droplets. It is noted that the successively ejected droplets have slightly different volumes as indicated in Table 3. However, the difference therebetween is a tolerably small amount.

As described above, also in the arrangements of the first and second modifications, each ink droplet can be given a larger velocity than the preceding ink droplet. In the arrangement of the first modification, the velocity of the ejected ink droplet is increased by the simple control using the principle that the velocity is changed depending upon the width of the drive pulse. In the arrangement of the second modification, the velocity of the ejected ink droplet is increased by the simple control using the principle that the velocity is changed depending upon the voltage of the drive pulse. The arrangement of the second modification requires a plurality of power sources, the number of which is dependent upon the number of used different voltage levels. However, the arrangement of the second modification permits the velocity of each ejected ink droplet to vary within a wide range, making it possible to easily make the ink droplets unite with each other at or in the vicinity of the intersection P even where the number of the ink droplets is large.

The arrangement of the first modification and/or the arrangement of the second modification may be combined with the above-described arrangement (shown in FIG. 21) in which the time interval between the trailing edges of two consecutive drive pulses, i.e. the time interval between the starting points of two consecutive ejections of the ink droplets is arranged to correspond to 2AL. By combining the three arrangements as needed, it is possible to vary the velocity of each ejected ink droplet in a wider range, thereby permitting the ink droplets to be reliably united with each other even where the number of the ink droplets is large.

There will be described an operation of each ink ejection unit 313 where the united ink droplet is given a variable volume, namely, where each ink ejection unit 313 is subjected to a control in accordance with an area gradation method. FIG. 25 is a table indicating a relationship among the numbers of the ink droplets ejected from the ink ejecting portions 314a, 314b of the ink ejection unit 313, the volumes of the ejected ink droplets and the landing position of the united ink droplet.

The constituent-droplet-number controller provided by the droplet-number determiner 352 and the drive-signal generator 353 controls a sum of the numbers of the ink droplets to be ejected from the first and second ink ejecting portions 14a, 14b of the ink ejection unit 313, so as to control the volume of the united ink droplet. By thus controlling the volume of the united ink droplet, it is possible to control an ink spot area defined by the united ink droplet placed at the predetermined position. In an example shown in the table of FIG. 25, the sum of the numbers of the ink droplets (each having a volume of 2 pl) ejected from the first and second ink ejecting portions 14a, 14b is three or six (3 or 6), so that the united ink droplet is given a volume of six or twelve (6 or 12) pl. Thus, the ink spot area is changeable in two steps.

Figure 26:
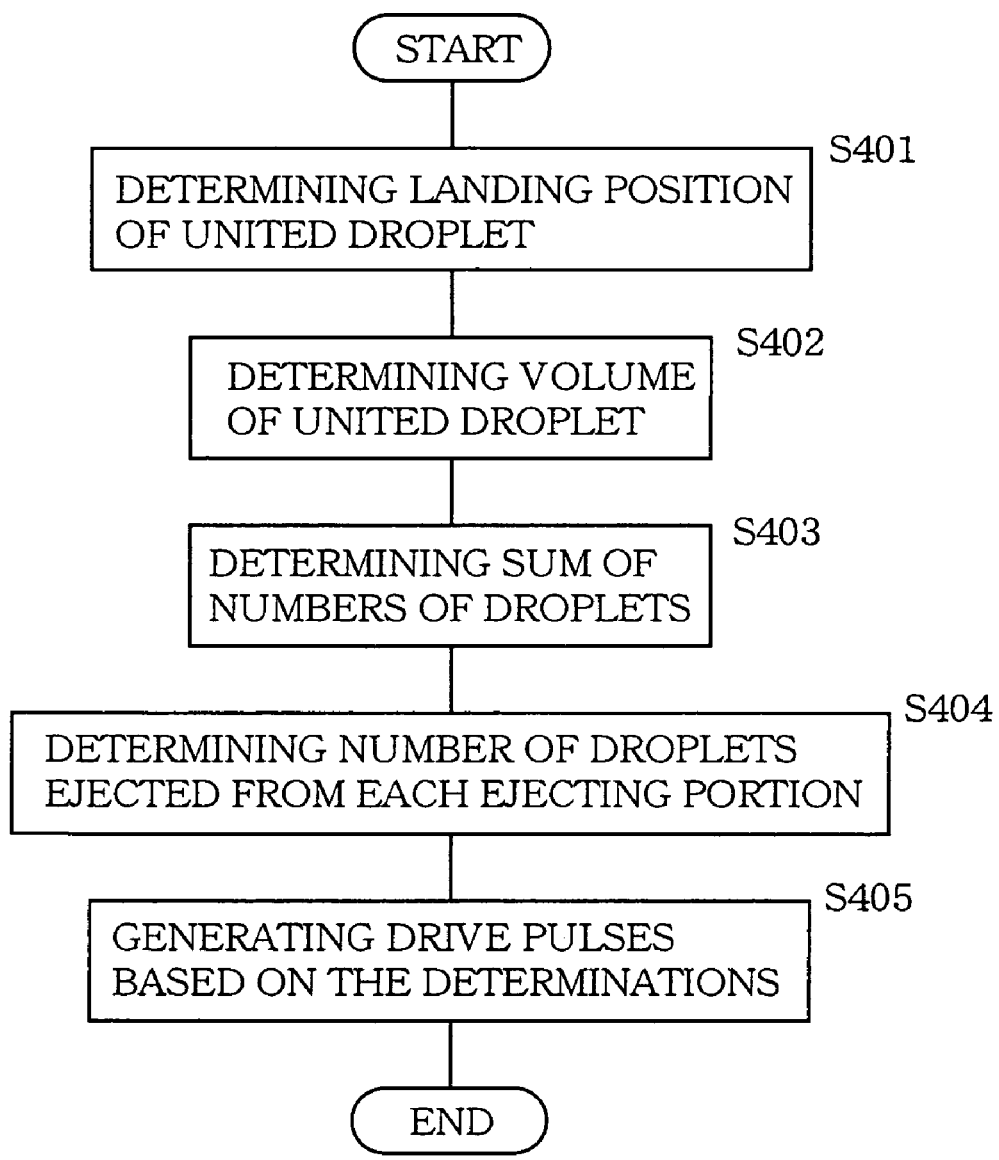
FIG. 26 is a flow chart showing an ink ejection control routine executed according to a control program stored in the controller of FIG. 19.

FIG. 26 is a flow chart illustrating an ink ejection control routine executed according to a control program stored in the controller 320. This ink ejection control routine is initiated with a step S401 that is implemented to determine which one of the positions V-Y the united ink droplet ejected from each of the ink ejection units 313 is to be placed at. Step S401 is followed by step S402 that is implemented to determine the volume of the united ink droplet on the basis of a desired grade of the ink spot area. In this instance, the volume V of the united ink droplet to be placed at the determined position is determined in accordance with the above-described expression (3) where "n" represents the number of the positions, "q" represents the volume of each of the ink droplets ejected from the first and second ink ejecting portions 314a, 314b, and "k" represents the desired grade of the ink spot area. In the present embodiment, the number "n" of the positions V-Y is four (n=4), the volume "q" of each ink droplet is 2 pl (q=2), and the desired grade "k" of the ink spot area can be one or two (k=1, 2). According to the expression (3), the volume "V" of the united ink droplet is 12 pl, where the desired grade "k" of the ink spot area is one (k=1).

Step S403 is then implemented to determine the sum R of the numbers of the ink droplets that are to be ejected from the first and second ink ejecting portions 314a, 314b, on the basis of the volume V of the united ink droplet determined at step S402. In this instance, the sum "R" of the numbers of the ink droplets is determined in accordance with the above-described expression (4). According to the expression (4), the sum "R" is 3 with the volume "V" of the united ink droplet being 6 pl (V=6), while the sum "R" is 6 with the volume "V" of the united ink droplet being 12 pl (V=12).

Step S403 is followed by step S404 in which the numbers of the ink droplets to be ejected from the respective first and second ink ejecting portions 314a, 314b are determined by the droplet-number determiner 352 of the controller 320, on the basis of the sum R and the landing position which are determined on the steps S403 and S401, respectively. In this instance, the number S1 of the ink droplets to be ejected from the first ink ejecting portion 314a and the number S2 of the ink droplets to be ejected from the second ink ejecting portion 314b are determined in accordance with the above-described expressions (5), (6). According to the above expressions (5), (6), the numbers S1 and S2 are one and two, respectively (S1 =1, S2 =2), where the desired grade "k" of the ink spot area is one (k=1). The numbers S1 and S2 are two and four, respectively (S1 =2, S2 =4), where the desired grade "k" of the ink spot area is one (k=1).

Then, the control flow goes to step S405 in which the drive-signal generator 353 generates drive pulses on the basis of the ejection timing determined by the ejection-timing determiner 351 and also the numbers S1, S2 determined at step S404. The generated drive pulses are outputted from the controller 320 to the ink ejecting portions 314a, 314b, which eject the ink droplets in response to the drive pulses.

Figure 27:
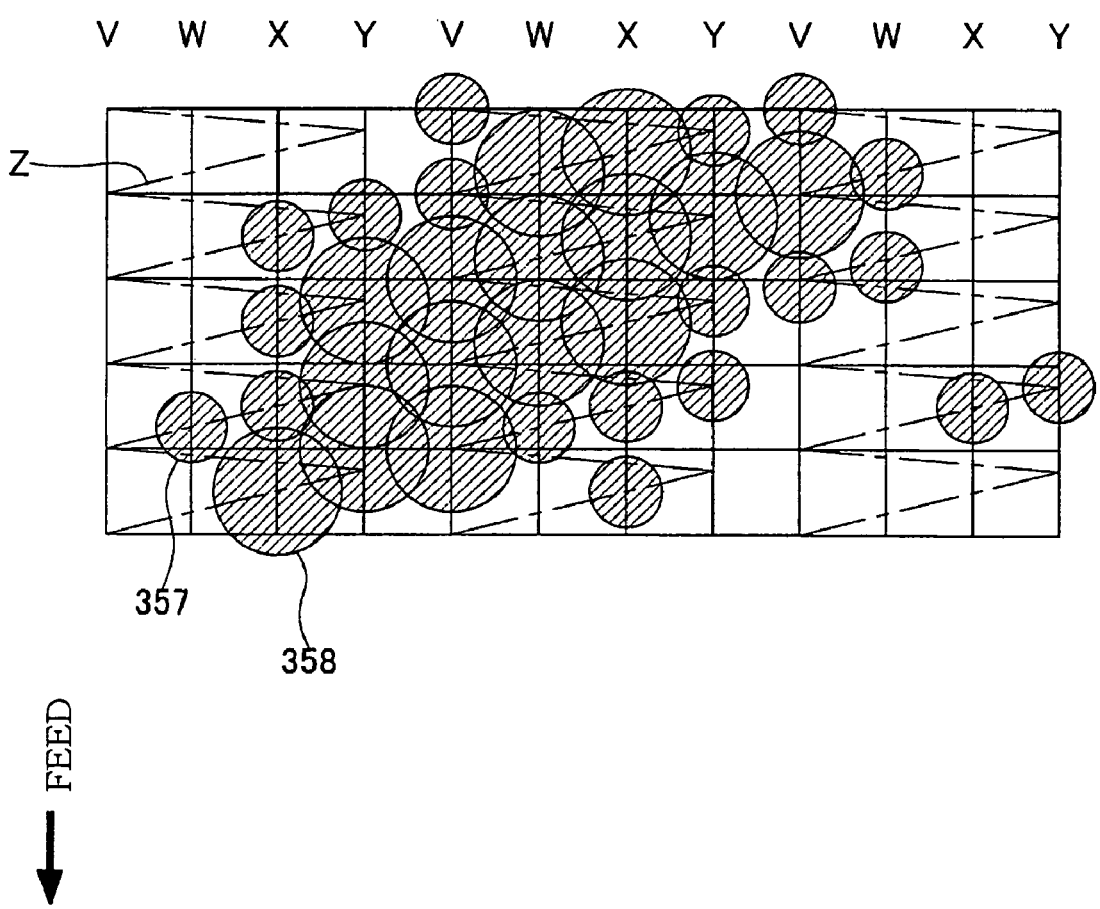
FIG. 27 is a view illustrating an example of placements of the united ink droplets made by the ejection unit of FIG. 16.

FIG. 27 is a view illustrating an example of placement of the united ink droplets performed by the ink ejection unit 313 in a printing operation in which the paper sheet 41 is fed in the feed direction indicated by arrow "FEED". As is apparent from FIG. 27, a plurality of united ink droplets 357, 358 are successively placed at desired positions on the paper sheet 41. A spacing distance between each adjacent pair of vertical lines (parallel with the feed direction of the paper sheet 41) corresponds to the spacing distance between each adjacent pair of the positions V-Y, while a spacing distance between each adjacent pair of horizontal lines (perpendicular to the feed direction of the paper sheet 41) corresponds to a distance by which the paper sheet 41 is fed for a length of time for which four united ink droplets can be placed on the paper sheet 41. It is noted that the united ink droplets 357, 358 have the respective volumes of 6 pl and 12 pl, respectively.

As shown in FIG. 27, the ink ejection unit 313 is controlled to place each of the united ink droplets 357, 358 at a determined one of the four positions V-Y such that the united ink droplets 357, 358 are placed at intersections of the vertical lines (parallel with the feed direction of the paper sheet 41) and a zigzag line represented by one-dot chain line in FIG. 27. That is, in the present embodiment, the united ink droplets are placed at the positions V-Y sequentially in this order.

Each united ink droplet 357 has a volume of 6 pl, while each united ink droplet 358 has a volume of 12 pl. Thus, each of the united ink droplets 357, 358 is constituted by a total of three or six ink droplets each ejected from the first ink ejecting portion 314a or second ink ejecting portion 314b (see the table of FIG. 25). That is, the controller 320 controls the ink ejection unit 313 such that the ink spot area defined by each united ink droplet is variable in two steps, not counting a case where no ink droplet is ejected from the ink ejecting portions 314a, 314b, i.e., a case where the ink spot area is zero. Further, irrespective of whether the ink ejection unit 313 is subjected to the gradation control or not, the ink ejection unit 313 having the two ink ejecting portions 314a, 314b is capable of printing an image in an area having substantially the same size (as measured in the feed direction of the paper sheet 41) as the ink ejection unit having four ink ejecting portions.

The present third embodiment provides the same technical advantages as the above-described first and second embodiments, and an additional technical advantage that the ink ejection units 313 can be arranged in the longitudinal direction of the main body 300 of the print head 309 with high density, owing to the arrangement in which the pressure chambers 310 arranged in the row on the lower part as seen in FIG. 16 are included in the first ink ejection portions 314a while the pressure chambers 310 arranged in the row on the upper part as seen in FIG. 16 are included in the second ink ejection portions 314b. That is, in the third embodiment in which the pressure chambers 310 of the pair of ink ejecting portions 314a, 314b of each ink ejection unit 313 are arranged in the direction perpendicular to the longitudinal direction of the main body 300 of the print head 309, the number of the ink ejection units 313 provided in the print head 309 can be twice as large as that of the ink ejection units 13 provided in the print head 9, where the main body 300 of the print head 309 has the same length as the main body 100 of the print head 9. Therefore, the number of the nozzles 8 provided in the print head 309 also can be twice as large as that of the nozzles 8 provided in the print head 9, thereby making it possible to arrange the nozzles 8 with a reduced spacing pitch therebetween. Consequently, the print head 309 makes it possible to perform a printing operation with higher resolution. Further, owing to the arrangement in which the time interval between the trailing edges of two consecutive drive pulses is arranged to correspond to 2AL, a pressure wave generated for the ejection of each ink droplet is synchronized with a residual pressure wave or waves generated for the ejection of the preceding ink droplet or droplets, so that each ejected ink droplet can be easily given a larger velocity than the previously ejected ink droplet, by utilizing the superimposed pressure waves.

Figure 28:
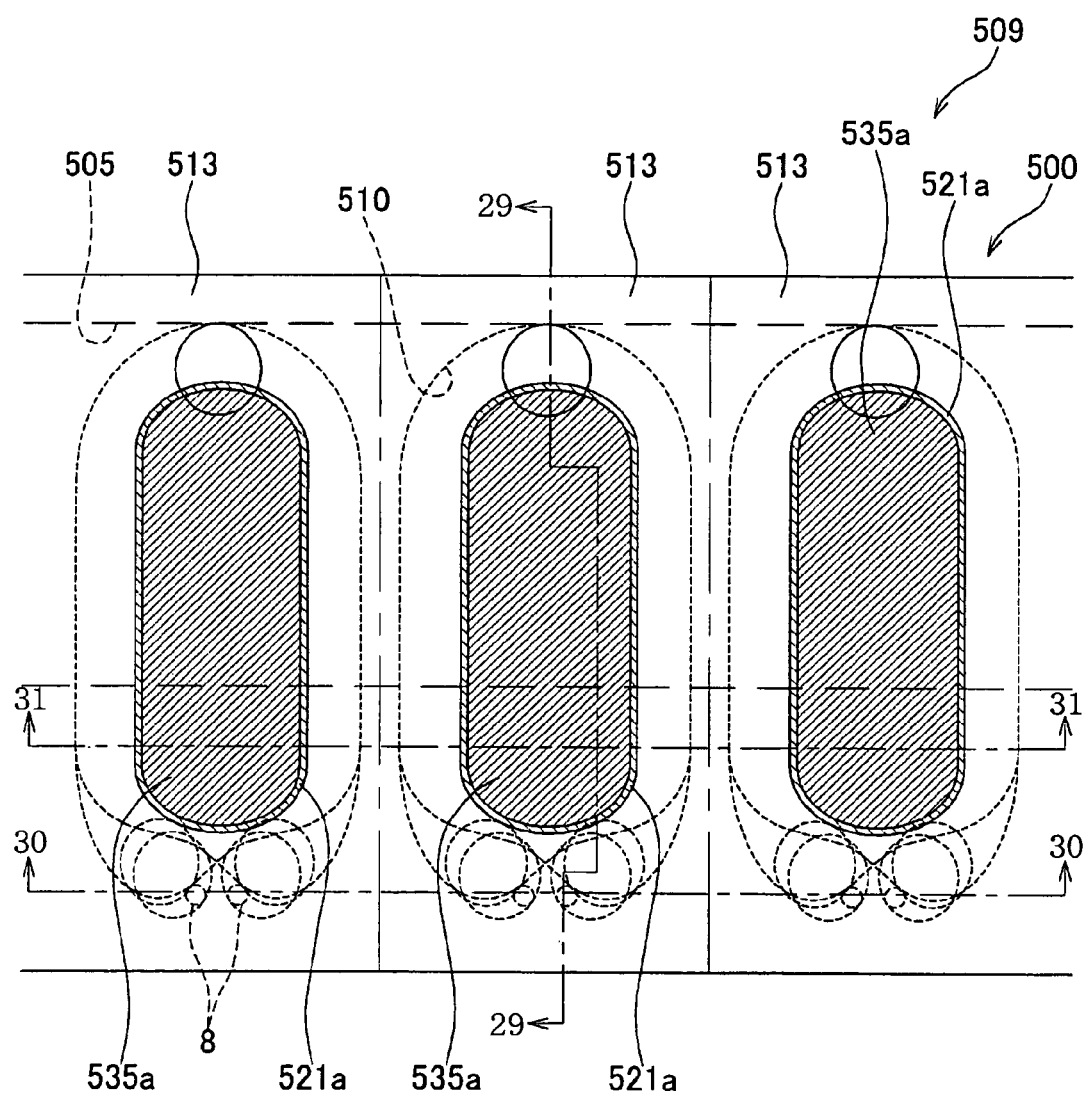
FIG. 28 is an enlarged plan view of a main body of a print head constructed according to a fourth embodiment of the invention.
Figure 29:
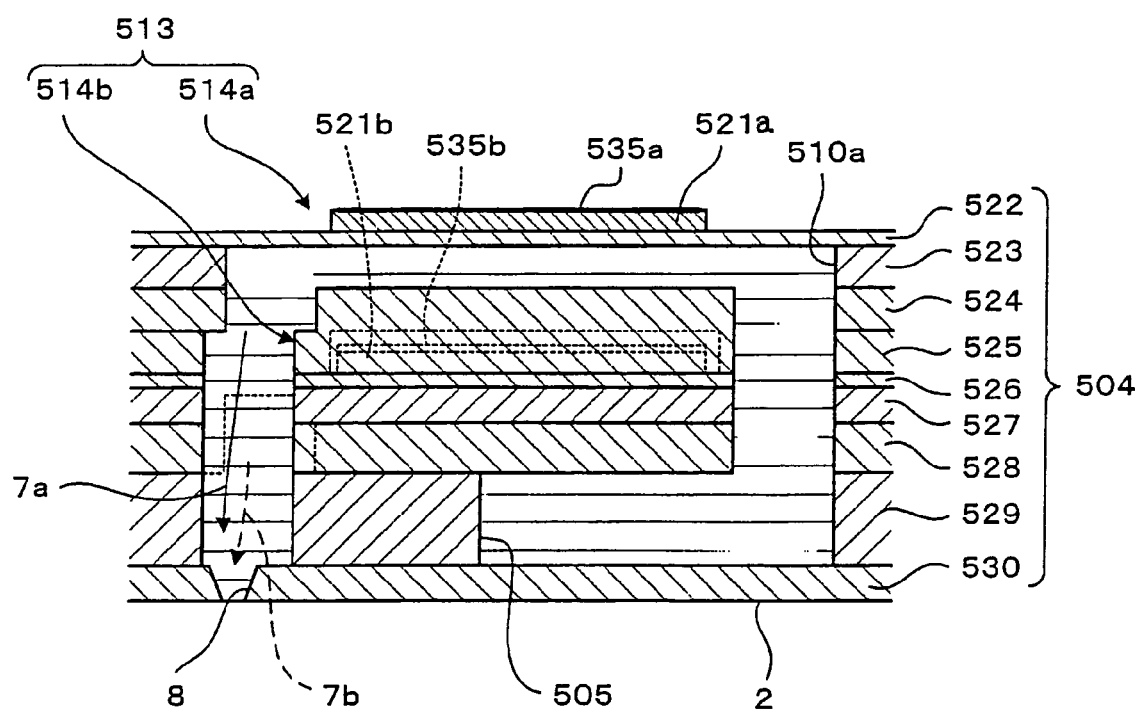
FIG. 29 is a view partly in cross section of the print head of FIG. 28, taken along line 29-29 of FIG. 28.
Figure 30:
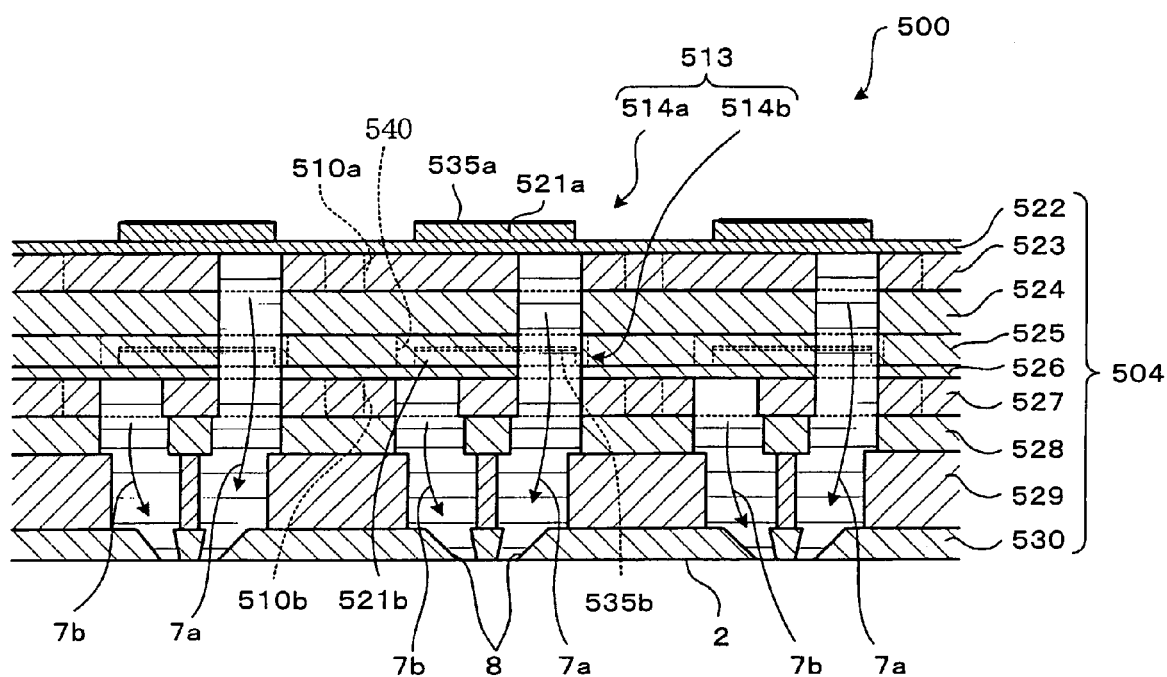
FIG. 30 is a view partly in cross section of the print head of FIG. 28, taken along line 30-30 of FIG. 28.

Referring next to FIGS. 28-31, there will be described a fourth embodiment of the invention. FIG. 28 is an enlarged plan view of a main body 500 of a print head 509 in fourth embodiment. FIG. 29 is a view partly in cross section taken along line 29-29 of FIG. 28. FIG. 30 is a view partly in cross section taken along line 30-30 of FIG. 28. This fourth embodiment is substantially identical with the third embodiment, except for its print head 509 which will be described below.

Like the print head 309 in the third embodiment, the print head 509 is of a line type, and has the main body 500 having the ejection face 2 provided by a rectangular flat face. As shown in FIGS. 28-31, the print head 509 has a passage-defining unit 504, piezoelectric sheets 521a, 521b and individual electrodes 535a, 535b in its main body 500. The passage-defining unit 504 has a laminated structure constituted by a plurality of plates 522-530 which are laminated on each other. As shown in FIG. 28, the passage-defining unit 504 defines a manifold chamber 505 which is elongated in the longitudinal direction of the passage-defining unit 504. The piezoelectric sheets 521a are provided on an upper surface of the passage-defining unit 504, while the piezoelectric sheets 521b are provided inside the passage-defining unit 504. The passage-defining unit 504 defines a multiplicity of pressure chambers 510a, 510b as droplet chambers which are arranged in the longitudinal direction of the passage-defining unit 504, such that the pressure chambers 510a are opposed to the respective piezoelectric sheets 521a while the pressure chambers 510b are opposed to the respective piezoelectric sheets 521b. The passage-defining unit 504 has a multiplicity of individual communication passages 7a, 7b defined by through-holes formed through the plates 523-530. The print head 509 has, in its main body 500, has a multiplicity of ink ejection units 513 which are constituted by the individual communication passages 7a, 7b, the piezoelectric sheets 521a, 521b and the individual electrodes 535a, 535b.

The ink ejection units 513 are connected to the controller 320, so as to be controlled by the controller 320 such that the united ink droplet having a desired volume is placed at a desired position on the receiver medium. The ejection units 513 are arranged in the direction in which the main body 500 of the print head 509 is elongated. Each of the ejection units 513 has a pair of ink ejecting portions (first and second ink ejecting portions) 514a, 514b which are arranged in the vertical direction, i.e., in a direction in which the plates 522-530 are laminated on each other.

The first and second ink ejecting portions 514a, 514b of each ejection unit 513 are capable of ejecting the ink droplets, independently of each other. That is, the ejections of the ink droplets from the first and second ink ejecting portions 514a, 514b are made at respective points of time which can be either the same or different from each other. The ink droplets ejected from the first and second ink ejecting portions 514a, 514b are adapted to have respective velocities which can be either the same or different from each other. The first ink ejecting portion 514a has the nozzle 8, the pressure chamber 510a located in an upper portion of the passage-defining unit 504, the piezoelectric sheet 521a opposed to the pressure chamber 510a, and the individual electrode 535a disposed on the upper surface of the piezoelectric sheet 521a. On the other hand, the second ink ejecting portion 514b has the nozzle 8, the pressure chamber 510b located in a vertically intermediate portion of the passage-defining unit 504, the piezoelectric sheet 521b opposed to the pressure chamber 510b, and the individual electrode 535b disposed on the upper surface of the piezoelectric sheet 521b. Each of the nozzles 8 is provided by a tapered hole which is formed through the nozzle plate 530 such that its diameter is decreased as viewed in a direction away from an inside surface of the nozzle plate 530 toward an outside surface (i.e., the ejection face 2) of the nozzle plate 530. As shown in FIG. 29, each of the nozzles 8 is held in communication with a corresponding one of the above-described manifold chambers 505 through the pressure chamber 510a or 510b. The first and second ink ejecting portions 514a, 514b are opposed to each other as viewed in a direction in which the droplets are ejected from the print head 509, i.e., in a direction perpendicular to the ejection face 2 of the print head 509. The tapered holes providing the nozzles 8 of the first and second ink ejecting portions 514a, 514b have respective axes which are inclined with respect to each other by a predetermined angle such that trajectories described by the ink droplets ejected from the respective first and second ink ejecting portions 514a, 514b intersect each other in a space between the ejection face 2 and the receiver medium.

As shown in FIG. 28, each of the pressure chambers 510a, 501b defined by the passage-defining unit 504 is provided by a chamber which has a substantially rectangular plan shape and which has rounded corners. Each of the pressure chambers 510a, 501b is elongated in the width direction of the passage-defining unit 504, and has lengthwise opposite end portions which are held in communication with the nozzle 8 and the manifold chamber 505, respectively. Thus, each of the nozzles 8 is held in communication with the manifold chamber 505 via the individual communication passage 7a having a portion provided by the pressure chamber 510a, or via the individual communication passage 7b having a portion provided by the pressure chamber 510b. The individual communication passage 7a is included in the first ink ejecting portion 514a, while the individual communication passage 7b is included in the first ink ejecting portion 514b.

Figure 31:
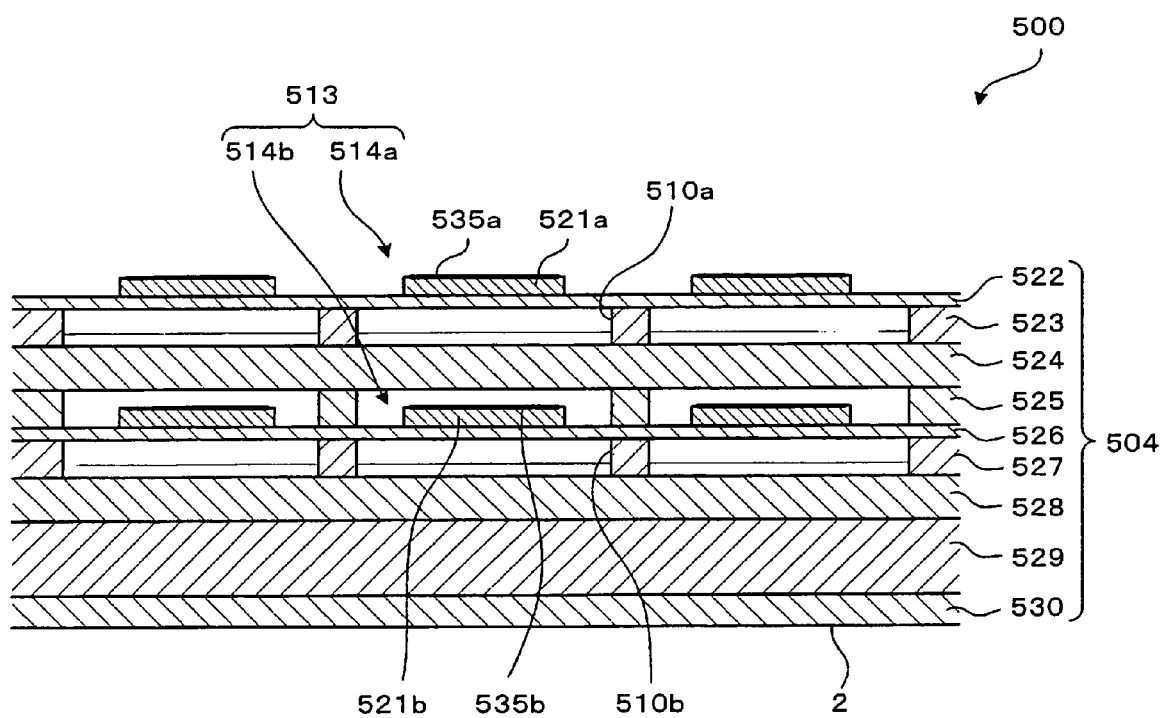
FIG. 31 is a view partly in cross section of the print head of FIG. 28, taken along line 31-31 of FIG. 28.

As shown in FIGS. 29-31, the passage-defining unit 504 has a laminated structure provided by a total of nine plates which are laminated on each other. The nine plates consist of a first actuator plate 522, a first cavity plate 523, a first supply plate 524, a second cavity plate 525, a second actuator plate 526, a second supply plate 527, a third supply plate 528, a manifold plate 529 and a nozzle plate 530.

The first actuator plate 522 is a metal plate provided to enclose upper openings of holes which are formed through the first cavity plate 523 to define the respective pressure chambers 510a. The first cavity plate 523 is a metal plate having the above-described holes (defining the pressure chambers 510a) formed in its portions which are opposed to the respective piezoelectric sheet 521a. The first supply plate 524 is a metal plate having communication holes communicating the manifold chamber 505 and the pressure chambers: 510a, and communication holes communicating the pressure chambers 510a and the nozzles 8. The second cavity plate 525 is a metal plate having communication holes communicating the manifold chamber 505 and the pressure chambers 510a, communication holes communicating the pressure chambers 510a and the nozzles 8, and holes defining spaces 540 each of which accommodates therein the corresponding individual electrode 535a and piezoelectric sheet 521b. The second actuator plate 526 is a metal plate having communication holes communicating the manifold chamber 505 and the pressure chambers 510a, and communication holes communicating the pressure chambers 510a and the nozzles 8. The third cavity plate 527 is a metal sheet having communication holes communicating the manifold chamber 505 and the pressure chambers 510a, communication holes communicating the pressure chambers 510a and the nozzles 8, and holes formed in its portions which are opposed to the respective piezoelectric sheet 521b, such that the formed holes define the respective pressure chambers 510b. The second supply plate 528 is a metal plate having communication holes communicating the manifold chamber 505 and the pressure chambers 510a (formed in the first cavity plate 523), communication holes communicating the manifold chamber 505 and the pressure chambers 510b (formed in the third cavity plate 537), communication holes communicating the pressure chambers 510a and the nozzles 8, and communication holes communicating the pressure chambers 510b and the nozzles 8. The manifold plate 529 is a metal plate having a hole defining the manifold chamber 505, communication holes communicating the pressure chambers 510a and the nozzles 8, and communication holes communicating the pressure chambers 510b and the nozzles 8. The nozzle plate 530 is a metal plate having the tapered holes defining the nozzles 8.

The above-described nine plates 522-530 are laminated on each other with such a positional relationship therebetween that permits the individual communication passages 7a, 7b to be formed. Each of the individual communication passages 7a, 7b includes a first section which vertically extends between the manifold chamber 505 and the pressure chamber 510a or 510b, a second portion which horizontally extends and which is provided by the pressure chamber 510a or 510b, and a third portion which vertically extends between the pressure chamber 510a or 510b and the nozzle 8.

In the print head 509 constructed as described above, the pressure chambers 510a are located in the upper portion of the passage-defining unit 504, while the pressure chambers 510b are located in the vertically intermediate portion of the passage-defining unit 504, so that the pressure chambers 510b are located on the lower side of the pressure chambers 510a. As shown in FIG. 31, each of the pressure chambers 510a and a corresponding one of the pressure chambers 510b overlap substantially at their entire portions with each other in the direction perpendicular to the ejection face 2, i.e., in the direction in which the plates 522-530 are laminated on each other. The piezoelectric sheets 521a are disposed on respective portions of the upper surface of the passage-defining unit 504, such that the piezoelectric sheets 521a are located right above the respective pressure chambers 510a. The piezoelectric sheets 521b are disposed inside the passage-defining unit 504, such that the piezoelectric sheets 521b are located right above the respective pressure chambers 510b. The individual electrodes 535a, 535b are disposed on the upper surfaces of the respective piezoelectric sheets 521a, 521b. Thus, each of the multiplicity of ink ejection units 513 built in the main body 500 of the print head 509 is constituted by the pair of ink ejecting portions 514a, 514b which are arranged in the direction in which the plates 522-530 are laminated on each other.

The piezoelectric sheets 520a, 520b and the individual electrodes 535a, 535b are formed of the same materials as those forming the above-described piezoelectric sheets 321 and the individual electrodes 335, and have the same functions as the piezoelectric sheets 321 and the individual electrodes 335. The individual electrodes 335 are connected to respective signal wires (not shown), which in turn are connected to the controller 320, so that an electric potential of each individual electrode 535 can be controlled by the controller 320 through the signal wires. The piezoelectric sheets 521a, 521b and the actuator plates 522, 526 constitute so-called unimorph actuators, like the piezoelectric sheets 321 and the actuator plate 322. Thus, like the print head 309 of the third embodiment, the print head 509 of the present fourth embodiment is operable to eject the ink droplets through the ink ejecting portions 514a, 514b so that the united ink droplet lands on the receiver medium.

In the print head 509 constructed according to the fourth embodiment, a spacing pitch between the nozzles 8 can be made smaller than that in the print head 9 of the first and second embodiments, and a width of the print head 509 (i.e., a size of the print head 509 as measured in the direction perpendicular to the longitudinal direction of the main body 500) can be made smaller than that of the print head 309 of the third embodiment. That is, in the main body 500 of the print head 509, the pressure chambers 510a, 510b overlap substantially at their entire portions with each other in the direction in which the plates 522-530 are laminated on each other, and are not arranged in a direction parallel with the ejection face 2. Therefore, even without reducing the spacing pitch between the nozzles 8, the print head 509 can have a smaller size as measured in the direction parallel with the ejection face 2, than the print head 309 of the third embodiment.

While the first through fourth embodiments of the invention have been described in detail, it is to be understood that the invention is not limited to the details of the above-described embodiments, but may be embodied with various other changes, modifications and improvements, without departing from the scope of the invention defined in the claims.

In the first through fourth embodiments, the pair of ink ejecting portions of each ink ejection unit are positioned to be adjacent to each other However, the pair of ink ejecting portions may be otherwise positioned relative to each other, provided that the trajectories described by the ink droplets ejected from the respective ink ejecting portions intersect each other. For example, the pair of ink ejecting portions may be spaced apart from each other by a certain distance. Further, the ink ejecting portions may be inclined with respect to the horizontal or vertical direction by a certain degree of angle.

In the first embodiment with the print head 9 of a line type, each of the ink ejection units 13 is not subjected to the gradation control so that the operation is performed without changing the volume of the united ink droplet. In the first embodiment, however, each ink ejection unit 13 may be subjected to the gradation control so as to perform the operation changing the volume of the united ink droplet. In the second embodiment with the print head 9A of a serial type, each ink ejection unit 13 is subjected to the gradation control so that the operation is performed with the volume of the united ink droplet being changed. In the second embodiment, however, each ink ejection unit 13 may not be subjected to the gradation control so as to perform the operation without changing the volume of the united ink droplet.

While each of the print heads 309, 509 of the third and fourth embodiments is of a line type, it may be of a serial type as that of the second embodiment.

Figure 33:
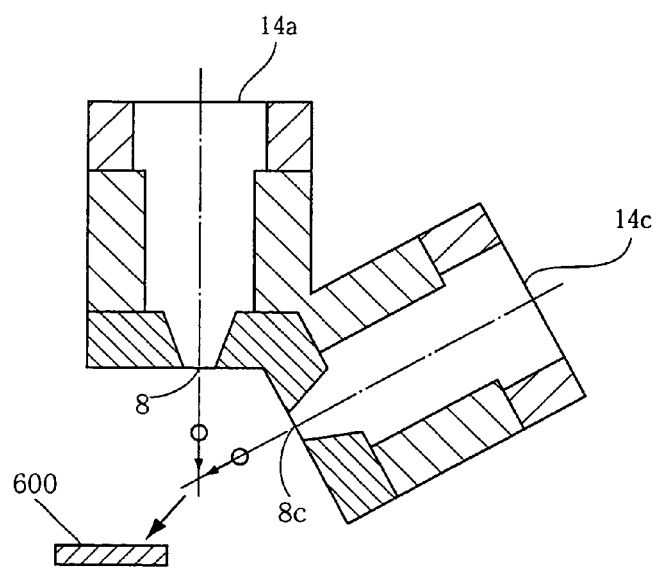
FIG. 33 is a view illustrating a modified arrangement in which third ink ejection portions as a droplet-unification inhibitor are provided in the droplet ejection device.

In the first through fourth embodiments, the volume and the landing position of the united ink droplet are changed by changing the numbers of the ink droplets ejected from the respective first and second ink ejecting portions. However, they can be changed without changing the numbers of the ejected ink droplets, as in an arrangement shown in FIG. 33 by way of example. In this arrangement, each ink ejection unit 13 includes, in addition to the first and second ink ejecting portions 14a, 14b, a pair of third ink ejecting portions 14c each of which is operable to eject the ink droplet in a direction intersecting a corresponding of the above-described first and second directions. As shown in FIG. 33, one of the third ink ejecting portions 14c is positioned relative to the first ink ejecting portion 14a such that the trajectories described by the ink droplets ejected from the respective first and third ink ejecting portions 14a, 14c intersect each other in a space between the ejection face 2 and the intersection at which the trajectories described by the ink droplets ejected from the respective first and second ink ejecting portions 14a, 14b. Similarly, the other third ink ejecting portion 14c (not shown) is positioned relative to the second ink ejecting portion 14b such that the trajectories described by the ink droplets ejected from the respective second and third ink ejecting portions 14b, 14c intersect each other the above-described space. With the provision of the third ink ejecting portions 14c as a droplet-unification inhibitor in the droplet ejection device, it is possible to inhibit unification of at least one of the ink droplets (ejected from the first and second ink ejecting portions 14a, 14b) with the other ejected ink droplets, by making the at least one of the ink droplets collide with the ink droplet or droplets ejected from the third ink ejecting portions 14c. The at least one of the ink droplets is carried by the ink droplet or droplets ejected from the third ink ejecting portions 14c, along a withdraw trajectory which is different from the above-described original trajectories, and is eventually caught by a withdrawn droplet catcher 600 which is provided to lie on the withdraw trajectory.

In the arrangement of FIG. 33, even where the numbers of the ink droplets ejected from the first and second ink ejecting portions 14a, 14b are held in constant, the number of the ink droplets constituting the united ink droplet can be changed by withdrawing at least one of the ink droplets ejected from the first and second ink ejecting portions 14a, 14b. In other words, the ratio between the numbers of the ink droplets ejected from the first and second ink ejecting portions 14a, 14b can be made different from the ratio between the number of the ink droplets ejected from the first ink ejecting portion 14a and constituting the united ink droplet and the number of the ink droplets ejected from the second ink ejecting portion 14b and constituting the united ink droplet.

In the first and second embodiments, each adjacent pair of the ink ejection units 13 are positioned relative to each other such that the spacing distance between each adjacent pair of the positions A-E to be equal to the spacing distance between the position E (at which the united ink droplet ejected from one of the pair of the ink ejection units 13 can be placed) and the position A (at which the united ink droplet ejected from the other of the pair of the ink ejection units 13 can be placed). However, each adjacent pair of the ink ejection units 13 may be otherwise positioned, for example, such that the position E (at which the united ink droplet ejected from the above-described one of the pair of the ink ejection units 13 can be placed) is positioned between the positions B and C (at which the united ink droplet ejected from the above-described other of the pair of the ink ejection units 13 can be placed), while the position A (at which the united ink droplet ejected from the above-described other of the pair of the ink ejection units 13 can be placed) is positioned between the positions C and D (at which the united ink droplet ejected from the above-described one of the pair of the ink ejection units 13 can be placed). This arrangement permits the resolution of the formed image to be doubled. Further, the first and second ink ejecting portions 14a, 14b of each ink ejection unit 13 may be positioned to be close to each other, to such an extent that permits the ink droplets from the respective ink ejecting portions 14a, 14b, to be brought into contact with each other before separating from the respective nozzles 8. It is noted that these modifications can be made also in the ink ejection units 313 of the third embodiment.

While the pulse width is AL in the example of the third embodiment shown in FIG. 21, the pulse width does not have to be necessarily AL, as long as the time interval between the trailing edges of two consecutive drive pulses, i.e. the time interval between the starting points of two consecutive ejections of the ink droplets is arranged to correspond to 2AL. Further, in the fourth embodiment, the pressure chambers 510a, 501b do not have to overlap at their entire portions with each other, as long as they overlap at least at their portions with each other.

In the third embodiment, the pressure chambers 310 of the pair of the ink ejecting portions 314a, 314b of each ejection unit 313 are positioned relative to each other such that the second straight line connecting centers of the respective pressure chambers 310 is perpendicular to the first straight line along which the nozzles 8 are arranged. However, the pressure chambers 310 may be positioned such that the second straight line intersects the first straight line at an angle other than 90°, provided that the pressure chambers 310 are positioned on respective opposite sides of the first straight line.

In the first through fourth embodiments, there have been described cases where the droplet ejection device of the present invention is incorporated in an inkjet printer, namely, where the droplet ejection device is used to eject the droplet in the form of an ink droplet toward a receiver medium such as a paper sheet. However, the present droplet ejection device is also advantageously used to eject a conductive paste as a droplet for printing a fine electric circuit pattern on a substrate, or to eject an organic phosphor as a droplet for preparing a display device such as organic electroluminescent display (OELD). Further, the present droplet device can be otherwise used for forming a fine dot on a receiver medium.

What is claimed is:

1. A droplet ejection device comprising:
   a first ejecting portion capable of ejecting first droplets in a first direction;
   a second ejecting portion capable of ejecting second droplets in a second direction intersecting said first direction, so that the droplets ejected from said first and second ejecting portions can be united to constitute a united droplet before landing on a receiver medium; and
   a constituent-droplet-number controller that controls a number of the droplets constituting the united droplet such that the united droplet is placed at a variable position on the receiver medium,
   wherein said constituent-droplet-number controller includes a constituent-droplet-number-ratio control portion which controls a ratio between numbers of the respective first and second droplets constituting the united droplet, for controlling the position at which the united droplet is placed.

2. The droplet ejection device according to claim 1, wherein said constituent-droplet-number-ratio control portion includes an ejected-droplet-number control portion which is connected to said first and second ejecting portions and which controls number of the droplets ejected from said first and second ejecting portions.

3. The droplet ejection device according to claim 1, wherein said constituent-droplet-number-ratio control portion includes a droplet-unification inhibitor which inhibits at least one of the ejected droplets from being united with an other of the ejected droplets.

4. The droplet ejection device according to claim 3, wherein said droplet-unification inhibitor includes a third ejecting portion operable to eject a third droplet in a third direction intersecting one of said first and second directions, so that the third droplet ejected from said third ejecting portion can be united with said at least one of the ejected droplets without unification of said at least one of the ejected droplets with an other of the ejected droplets, whereby said at least one of the ejected droplets is carried by the third droplet in a direction different from said first and second directions.

5. The droplet ejection device according to claim 1, further comprising:
   an ejection controller which is connected to said first and second ejecting portions and which controls at least one of a point of time at which each of the droplets is ejected from a corresponding one of the first and second ejecting portions, and a velocity of each of the ejected droplets, such that the ejected droplets are united to constitute the united droplet before landing on the receiver medium.

6. The droplet ejection device according to claim 5, wherein said ejection controller controls velocities of the ejected droplets, for controlling the position at which the united droplet is placed.

7. The droplet ejection device according to claim 5, wherein each of said first and second ejecting portions is capable of successively ejecting the droplets,
   and wherein said ejection controller controls velocities of the ejected droplets such that each of the droplets is given a larger velocity than another of the droplets which is ejected before ejection of said each of the droplets.

8. The droplet ejection device according to claim 7, wherein each of said first and second ejecting portions includes:
   a nozzle;
   a pressure chamber; and
   a manifold chamber which is held in communication with said nozzle through said pressure chamber,
   and wherein said ejection controller controls said point of time, such that a time interval between starting points of two successive ejections of the droplets from the corresponding one of said first and second ejecting portions is twice as long as a length of propagation time required for a pressure wave to be propagated from said manifold chamber to said nozzle.

9. The droplet ejecting device according to claim 8, wherein each of said first and second ejecting portions further includes a pressure-chamber-volume changer which is actuated in response to a drive signal supplied from said ejection controller, to change a volume of said pressure chamber, for thereby generating the pressure wave in said pressure chamber,
   wherein said drive signal is provided by a pulse train including a plurality of first voltage-level regions for causing said pressure-chamber-volume changer to reduce the volume of said pressure chamber, and a plurality of second voltage-level regions for causing said pressure-chamber volume changer to increase the volume of said pressure chamber, such that the first and second voltage-level regions are alternately arranged in said pulse train, and wherein each of said second voltage-level regions has a time length corresponding to said length of propagation time.

10. The droplet ejecting device according to claim 9, wherein each of said first voltage-level regions has a time length corresponding to said length of propagation time.

11. The droplet ejection device according to claim 7, wherein each of said first and second ejecting portions includes:
a nozzle;
a pressure chamber which is held in communication with said nozzle; and
a pressure-chamber-volume changer which is actuated in response to a drive signal supplied from said ejection controller, to change a volume of said pressure chamber,
wherein said drive signal is provided by a pulse train including a plurality of first voltage-level regions for causing said pressure-chamber-volume changer to reduce the volume of said pressure chamber, and a plurality of second voltage-level regions for causing said pressure-chamber volume changer to increase the volume of said pressure chamber, such that the first and second voltage-level regions are alternately arranged in said pulse train,
and wherein said plurality of second voltage-level regions have different lengths of times.

12. The droplet ejection device according to claim 11, wherein each of said first and second ejecting portions further includes a manifold chamber which is held in communication with said nozzle through said pressure chamber,
and wherein each of said plurality of second voltage-level regions has a length of time closer to a length of propagation time which is required for a pressure wave to be propagated from said manifold chamber to said nozzle, than another of said plurality of second voltage-level regions which precedes said each of said plurality of second voltage-level regions.

13. The droplet ejection device according to claim 7, wherein each of said first and second ejecting portions includes:
a nozzle;
a pressure chamber which is held in communication with said nozzle; and
a pressure-chamber-volume changer which is actuated in response to a drive signal supplied from said ejection controller, to change a volume of said pressure chamber,
wherein said drive signal is provided by a pulse train including a plurality of first voltage-level regions for causing said pressure-chamber-volume changer to reduce the volume of said pressure chamber, and a plurality of second voltage-level regions for causing said pressure-chamber volume changer to increase the volume of said pressure chamber, such that the first and second voltage-level regions are alternately arranged in said pulse train,
and wherein a voltage difference between each adjacent pair of said first and second voltage-level regions is larger than a voltage difference between another adjacent pair of said first and second voltage-level regions which precedes said each adjacent pair of said first and second voltage-level regions.

14. The droplet ejection device according to claim 1, wherein said first and second ejecting portions eject the droplets such that the ejected droplets have substantially the same volume,
and wherein said constituent-droplet-number controller controls the number of the droplets constituting the united droplet such that the united droplet is given a volume which is substantially constant irrespective of the position at which the united droplet is placed.

15. The droplet ejection device according to claim 1, wherein said first and second ejecting portions eject the droplets such that the ejected droplets have substantially the same volume,
and wherein said constituent-droplet-number controller controls the number of the droplets constituting the united droplet such that the united droplet is given a variable volume which varies depending upon the number of the droplets constituting the united droplet and which does not vary depending upon the position at which the united droplet is placed.

16. The droplet ejection device according to claim 1, wherein said constituent-droplet-number controller includes a constituent-droplet-total-number control portion which controls a sum of numbers of the respective first and second droplets constituting the united droplet, for controlling a volume of the united droplet.

17. The droplet ejection device according to claim 1, further comprising:
a plurality of ejection units each including a pair of ejecting portions consisting of said first and second ejecting portions,
wherein each of said pair of ejecting portions includes a nozzle and a droplet chamber which is held in communication with said nozzle,
wherein the nozzles of said first and second ejecting portions are arranged in a predetermined direction,
and wherein said droplet chamber of one of said pair of ejecting portions is disposed on one of opposite sides of a first straight line extending in said predetermined direction, while said droplet chamber of an other of said pair of ejecting portions is disposed on an other of said opposite sides of said first straight line.

18. The droplet ejection device according to claim 17, wherein said first straight line is substantially perpendicular to a second straight line which connects between a center of said droplet chamber of one of said pair of ejecting portions and a center of said droplet chamber of the other of said pair of ejecting portions.

19. The droplet ejection device according to claim 1, further comprising:
a plurality of ejection units each including a pair of ejecting portions consisting of said first and second ejecting portions,
wherein each of said pair of ejecting portions includes a nozzle and a droplet chamber which is held in communication with said nozzle,
wherein the nozzles of said first and second ejecting portions are arranged in a predetermined direction,
and wherein said droplet chamber of one of said pair of ejecting portions and said droplet chamber of an other of said pair of ejecting portions overlap at least at portions thereof with each other in an ejection direction in which the droplets are ejected from said droplet ejection device.

* * * * *